(12) United States Patent
Kim et al.

(10) Patent No.: US 8,471,643 B2
(45) Date of Patent: Jun. 25, 2013

(54) ELECTROMECHANICAL SYSTEMS OSCILLATOR WITH PIEZOELECTRIC CONTOUR MODE RESONATOR FOR MULTIPLE FREQUENCY GENERATION

(75) Inventors: Jonghae Kim, San Diego, CA (US);
Je-Hsiung Lan, San Diego, CA (US);
Changhan Yun, San Diego, CA (US);
Chi Shun Lo, San Diego, CA (US);
Matthew Nowak, San Diego, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 68 days.

(21) Appl. No.: 13/107,764

(22) Filed: May 13, 2011

(65) Prior Publication Data
US 2012/0286886 A1    Nov. 15, 2012

(51) Int. Cl.
*H03B 5/30*      (2006.01)
(52) U.S. Cl.
USPC ...... 331/155; 331/73; 331/116 R; 331/107 A; 331/107 P; 331/107 DP; 331/139; 331/156; 333/174; 333/187; 333/189
(58) Field of Classification Search
USPC ........... 331/73, 116 R, 107 A, 107 P, 107 DP, 331/139, 155, 156; 333/174, 187, 189
See application file for complete search history.

(56) References Cited

U.S. PATENT DOCUMENTS

| | | | |
|---|---|---|---|
| 6,741,146 B2 | 5/2004 | Ella | |
| 7,492,241 B2 | 2/2009 | Piazza et al. | |
| 8,026,771 B2 * | 9/2011 | Kanai et al. | 331/173 |
| 8,193,869 B1 * | 6/2012 | Brown et al. | 331/158 |
| 2003/0197566 A1 | 10/2003 | Kawashima | |
| 2005/0174198 A1 | 8/2005 | Razafimandimby et al. | |
| 2008/0143450 A1 * | 6/2008 | Matsumoto et al. | 331/116 R |
| 2008/0252178 A1 | 10/2008 | Yamada | |
| 2009/0072663 A1 * | 3/2009 | Ayazi et al. | 310/320 |
| 2009/0174503 A1 | 7/2009 | Carpentier | |
| 2009/0261923 A1 | 10/2009 | Kawashima | |
| 2009/0307884 A1 * | 12/2009 | Duwel et al. | 29/25.35 |
| 2010/0014277 A1 * | 1/2010 | Delany | 362/95 |

OTHER PUBLICATIONS

Maxey, Christopher A., Switched-Tank VCO Designs and Single Crystal Silicon Contour-Mode Disk Resonators for use in Multiband Radio Frequency Sources, (Jul. 30, 2004) (M.S. thesis, Virginia Polytechnic Institute and State University).
International Search Report and Written Opinion—PCT/US2012/037599—ISA/EPO—Jul. 18, 2012.
Rinaldi M., et al., "Use of a Single Multiplexed CMOS Oscillator as Direct Frequency read-out for an Array of eight AlN Contour-Mode NEMS Resonant Sensors", Sensors, 2010 IEEE, IEEE, Piscataway, NJ, USA, Nov. 1, 2010, pp. 2666-2670, XP031977726.

* cited by examiner

*Primary Examiner* — Arnold Kinkead
*Assistant Examiner* — Richard Tan
(74) *Attorney, Agent, or Firm* — Weaver Austin Villeneuve & Sampson LLP

(57) ABSTRACT

Electromechanical systems resonator structures, devices, circuits, and systems are disclosed. In one aspect, an oscillator includes an active component and a passive component connected in a feedback configuration. The passive component includes one or more contour mode resonators (CMR). A CMR includes a piezoelectric layer disposed between a first conductive layer and a second conductive layer. The conductive layers include an input electrode and an output electrode. The passive component is configured to output a first resonant frequency and a second resonant frequency, which is an odd integer harmonic of the first resonant frequency. The active component is configured to output a signal including the first resonant frequency and the second resonant frequency. This output signal can be a substantially square wave signal, which can serve as a clock in various applications.

24 Claims, 17 Drawing Sheets

ELECTROMECHANICAL SYSTEMS OSCILLATOR WITH PIEZOELECTRIC CONTOUR MODE RESONATOR FOR MULTIPLE FREQUENCY GENERATION

TECHNICAL FIELD

This disclosure relates generally to resonators and more specifically to electromechanical systems oscillators and contour mode resonators.

DESCRIPTION OF THE RELATED TECHNOLOGY

Electromechanical systems include devices having electrical and mechanical elements, transducers such as actuators and sensors, optical components (e.g., mirrors), and electronics. Electromechanical systems can be manufactured at a variety of scales including, but not limited to, microscales and nanoscales. For example, microelectromechanical systems (MEMS) devices can include structures having sizes ranging from about one micron to hundreds of microns or more. Nanoelectromechanical systems (NEMS) devices can include structures having sizes smaller than one micron including, for example, sizes smaller than several hundred nanometers. Electromechanical elements may be created using deposition, etching, lithography, and/or other micromachining processes that etch away parts of substrates and/or deposited material layers, or that add layers to form electrical, mechanical, and electromechanical devices.

One type of electromechanical systems device is called an interferometric modulator (IMOD). As used herein, the term interferometric modulator or interferometric light modulator refers to a device that selectively absorbs and/or reflects light using the principles of optical interference. In some implementations, an interferometric modulator may include a pair of conductive plates, one or both of which may be transparent and/or reflective, wholly or in part, and capable of relative motion upon application of an appropriate electrical signal. In an implementation, one plate may include a stationary layer deposited on a substrate and the other plate may include a reflective membrane separated from the stationary layer by an air gap. The position of one plate in relation to another can change the optical interference of light incident on the interferometric modulator. Interferometric modulator devices have a wide range of applications, and are anticipated to be used in improving existing products and creating new products, especially those with display capabilities.

Various electronic components and circuits can be implemented at the electromechanical systems level, such as oscillators. One conventional oscillator incorporates an LC circuit as a passive electrical resonator of the oscillator. A conventional LC circuit includes an inductor and a capacitor, also referred to as an LC tank. The inductor and the capacitor are connected together, and the LC tank is connected to one or more other circuit components. Electric current in the LC tank reaches a maximum at the LC tank's resonant frequency. LC tanks can be incorporated as components in applications such as filters, tuners and frequency mixers. Conventional LC tanks, that is, incorporating an inductor and a capacitor, often have a low quality (Q) factor indicating a higher than desirable amount of energy loss. Conventional LC tanks also can have a large form factor. For instance, the inductor of the LC tank can occupy an unacceptably large amount of chip real estate and can cause electromagnetic interference problems.

SUMMARY

The structures, devices, apparatus, systems, and processes of the disclosure each have several innovative aspects, no single one of which is solely responsible for the desirable attributes disclosed herein.

Disclosed are implementations of electromechanical systems resonator structures, such as contour mode resonators (CMR), devices, apparatus, systems, and related fabrication processes.

According to one innovative aspect of the subject matter described in this disclosure, apparatus including a resonator-based oscillator is provided. An active component has an input and an output. A passive component has an input coupled to the active component output and an output coupled to the active component input. The passive component includes one or more CMRs having dimensions including a length, a width, and a thickness. The CMR includes a first conductive layer, a second conductive layer, and a piezoelectric layer disposed between the first conductive layer and the second conductive layer. An input electrode is defined in one of the conductive layers and longitudinally oriented along the length. The input electrode is coupled to the passive component input. An output electrode is defined in one of the conductive layers and longitudinally oriented along the length. The output electrode is coupled to the passive component output. The passive component is configured to output a first resonant frequency and a second resonant frequency, which is an odd integer harmonic of the first resonant frequency. The active component is configured to output a signal including the first resonant frequency and the second resonant frequency. This output signal can be a substantially square wave signal having the first resonant frequency. Such a square wave signal can serve as a clock signal in some applications.

In some examples, a first CMR is configured to generate the first resonant frequency, and a second CMR is configured to generate the second resonant frequency. These CMRs can be coupled to one another in parallel. A resonant frequency can be associated with one or more parameters of the a CMR, such as the width, length, or thickness of the CMR, a spacing of electrodes in one or more of the conductive layers of the CMR, or a width of electrodes in one or more of the conductive layers of the CMR.

In some other examples, the same CMR is configured to generate the first resonant frequency and the second resonant frequency. The first resonant frequency can be associated with a first dimension of the CMR, and the second resonant frequency is associated with a second dimension of the CMR. In one example, the first resonant frequency is associated with the width of the CMR, the second resonant frequency is associated with the length of the CMR, and the third resonant frequency is associated with the thickness of the CMR.

According to another innovative aspect of the subject matter described in this disclosure, apparatus including a resonator-based oscillator is provided. The apparatus includes active component means for providing a signal including a first resonant frequency and a second resonant frequency, which is an odd integer harmonic of the first resonant frequency. The active component means has an input and an output. The apparatus also includes passive component means for outputting the first resonant frequency and the second resonant frequency. The passive component means has an input coupled to the active component means output and an output coupled to the active component means input. The passive component means includes one or more CMRs as described above.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

The included drawings are for illustrative purposes and serve only to provide examples of possible structures and configurations of the disclosed resonator structures, devices, apparatus, systems, and related processes.

Like reference numbers and designations in the various drawings indicate like elements.

DETAILED DESCRIPTION

Figure 1:
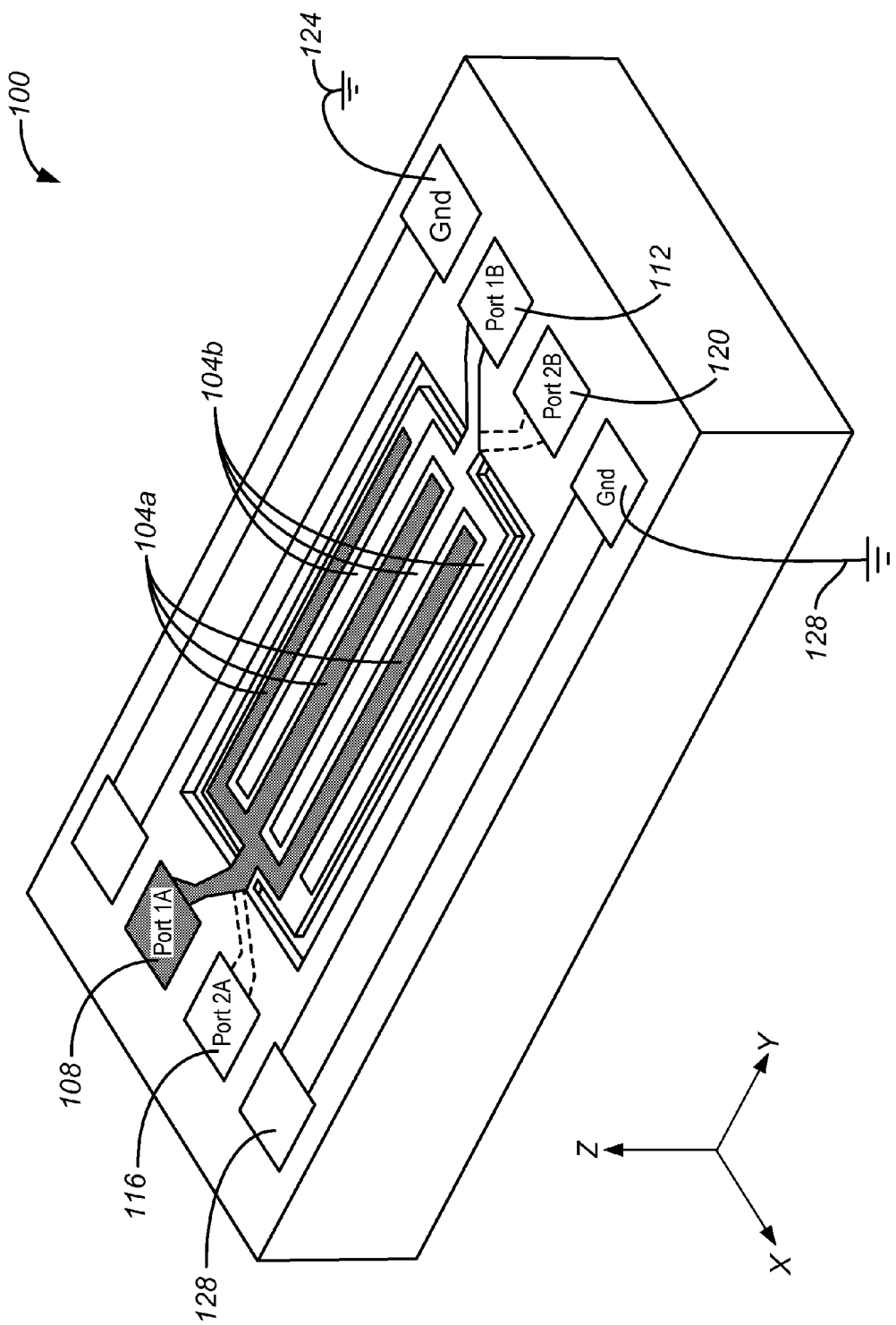
FIG. 1 shows an example of a perspective view of a contour mode resonator (CMR) device.

The following detailed description is directed to certain implementations for the purposes of describing the innovative aspects. However, the teachings herein can be applied in a multitude of different ways.

The disclosed implementations include examples of structures and configurations of electromechanical systems resonator devices, such as contour mode resonators (CMR). Related apparatus, systems, and fabrication processes and techniques are also disclosed. CMRs are referred to as "contour mode" because of their substantially in-plane mode of vibration, as described in greater detail below. In the case of piezoelectric resonators, an electric field applied between electrodes is transduced into a mechanical strain in a piezoelectric material. Thus, a time-varying electrical signal can be provided to an input electrode of the CMR and transduced to a corresponding time-varying mechanical motion. A portion of this mechanical energy can be transferred back to electrical energy at the input electrode or at a separate output electrode. The input and output electrodes are generally disposed in contact with or in proximity to the piezoelectric material. For instance, the electrodes can be located on the same surface or on opposite surfaces of a layer of the piezoelectric material. The frequency of the input electrical signal that produces the greatest substantial amplification of the mechanical displacement amplitude in the piezoelectric material is generally referred to as a resonant frequency of the CMR.

In one or more implementations of the disclosed CMRs, the resonator structure is suspended in a cavity and generally includes two conductive electrode layers, with a layer of piezoelectric material sandwiched between the two electrode layers. The resonator structure can be suspended in the cavity by specially designed tethers, which are often fabricated in the same layer stack of the resonator structure itself. The resonator structure is acoustically isolated from surrounding structural support and apparatus by virtue of the cavity.

Some implementations described herein are based on a contour mode resonator configuration. In such implementations, the resonant frequency of a CMR can be substantially controlled by engineering the lateral dimensions of the piezoelectric material and electrodes. One benefit of such a construction is that multi-frequency RF filters, clock oscillators, transducers or other devices, each including one or more CMRs depending on the desired implementation, can be fabricated on the same substrate. For example, this may be advantageous in terms of cost and size by enabling compact, multi-band filter solutions for RF front-end applications on a single chip. By co-fabricating multiple CMRs, each with different finger widths, as described in greater detail below, multiple frequencies can be addressed on the same die. Arrays of CMRs with different frequencies spanning a range from MHz to GHz can be fabricated on the same substrate.

With the disclosed CMRs, direct frequency synthesis for spread spectrum communication systems may be enabled by multi-frequency narrowband filter banks including high quality (Q) resonators, without the need for phase locked loops. The disclosed CMR implementations can provide for piezoelectric transduction with low motional resistance while maintaining high Q factors and appropriate reactance values that facilitate their interface with contemporary circuitry. Some examples of the disclosed laterally vibrating resonator microstructures provide the advantages of compact size, e.g., on the order of 100 um (micrometers) in length and/or width, low power consumption, and compatibility with high-yield mass-producible components.

The disclosed implementations include oscillators having one or more resonators coupled as passive components to an active circuit to produce multiple frequencies. For example, the resonator can be in the form of a CMR with a piezoelectric material such as aluminum nitride (AlN). The resonator(s) and active components can be incorporated into the same MEMS device. Applications of the disclosed implementations include harmonic oscillators configured to generate appropriate frequency components of a desired output signal form, such as a square wave, for various applications including digital clocks. In such implementations, the passive component can be configured to output a fundamental frequency and one or more odd integer harmonics of the fundamental frequency. In one example, a single resonator can provide a fundamental frequency and one or two harmonics in association with oscillations in respective different dimensions, e.g., length, width, and thickness of the resonator. In other examples, additional resonators can be connected in parallel to provide one or more of the fundamental frequency and the desired harmonics.

Particular implementations of the subject matter described in this disclosure can be implemented to realize one or more of the following potential advantages. One or more MEMS resonators such as CMRs can be incorporated in an oscillator to produce the appropriate frequency components of a desirable signal waveform. High frequency signals can be generated using oscillators constructed in accordance with the disclosed implementations. For instance, the disclosed resonator and oscillator configurations can be used to produce the harmonic components of a square wave to be used as a high speed clock signal, e.g., on the order of GHz, for various digital data processing applications. Incorporating the disclosed MEMS-based resonators into oscillators can improve circuit performance and lower manufacturing costs. Such MEMS-based resonators and oscillators also can be realized with smaller form factors.

The disclosed resonator structures can be fabricated on a low-cost, high-performance, large-area insulating substrate or panel. In some implementations, the insulating substrate on which the disclosed resonator structures are formed can be made of display grade glass (alkaline earth boro-aluminosilicate) or soda lime glass. Other suitable insulating materials include silicate glasses, such as alkaline earth aluminosilicate, borosilicate, modified borosilicate, and others. Also, ceramic materials such as aluminum oxide (AlOx), yttrium oxide ($Y_2O_3$), boron nitride (BN), silicon carbide (SiC), aluminum nitride (AlNx), and gallium nitride (GaNx) can be used as the insulating substrate material. In some other implementations, the insulating substrate is formed of a high-resistivity silicon substrate. Silicon On Insulator (SOI) substrates, gallium arsenide (GaAs) substrates, indium phosphide (InP) substrates, and plastic (polyethylene naphthalate or polyethylene terephthalate) substrates, e.g., associated with flexible electronics, also can be used. The substrate can be in conventional Integrated Circuit (IC) wafer form, e.g., 4-inch, 6-inch, 8-inch, 12-inch, or in large-area panel form. For example, flat panel display substrates that have dimensions such as 370 mm×470 mm, 920 mm×730 mm, and 2850 mm×3050 mm, can be used.

In some implementations, the structures are fabricated by depositing a sacrificial (SAC) layer on the substrate; forming a lower electrode layer on the SAC layer; depositing a piezoelectric layer on the lower electrode layer; forming an upper electrode layer on the piezoelectric layer; and removing at least part of the SAC layer to define a cavity. The resulting resonator cavity separates at least a portion of the lower electrode layer from the substrate and provides spaces along the sides of the resonator structure, as illustrated in the accompanying figures, to allow the resonator to vibrate and move in one or more directions with substantial elastic isolation from the remaining substrate. In some other implementations, a portion of the substrate itself serves as a SAC material. In these implementations, designated regions of the insulating substrate below the resonator structure can be removed, for example, by etching to define the cavity.

FIG. 1 shows an example of a perspective view of a CMR device. In FIG. 1, a CMR structure 100 includes an upper conductive layer of electrodes 104a and 104b. The first electrodes 104a are connected to a first input port 108, referred to as "Port 1A." The second electrodes 104b are connected to a first output port 112, referred to as "Port 1B." A lower conductive layer of electrodes is situated underneath the upper conductive layer on the opposite side of a sandwiched piezoelectric layer, as described below. In one example, the lower conductive layer includes a similar arrangement of first electrodes underlying the first electrodes 104a of the upper conductive layer and connected to a port 116, referred to as "Port 2A," and a similar arrangement of second electrodes underlying the second electrodes 104b of the upper conductive layer and connected to a port 120, referred to as "Port 2B." The ports 116 and 120 can be configured as a second input port and a second output port, respectively, in some implementations.

In FIG. 1, as further described below, the ports 108, 112, 116 and 120 can have different configurations. For instance, Ports 2A and 2B can be coupled to ground 124 and/or ground 128, thus grounding the lower conductive layer of electrodes, while an input electrical signal can be provided to Port 1A, resulting in an output electrical signal being provided to port 1B. In another configuration, a first input signal can be provided to Port 1A, and a second input signal can be provided to Port 2A, responsive to which a first output signal can be delivered to Port 1B, and a second output signal can be delivered to Port 2B. The piezoelectric layer can be disposed between the upper conductive layer and the lower conductive layer to translate the input signal(s) to mechanical vibration, which can then be translated to the output signal(s).

In the example of FIG. 1, the electrodes in the respective conductive layers have longitudinal axes substantially oriented along a Y axis, illustrated in FIG. 1. The X, Y and Z axes of FIG. 1 and additional figures described below are provided for reference and illustrative purposes only. In this example, the electrodes are generally straight along their longitudinal axes. Thus, in such examples, the electrodes are sometimes referred to herein as "fingers."

Figure 2A:
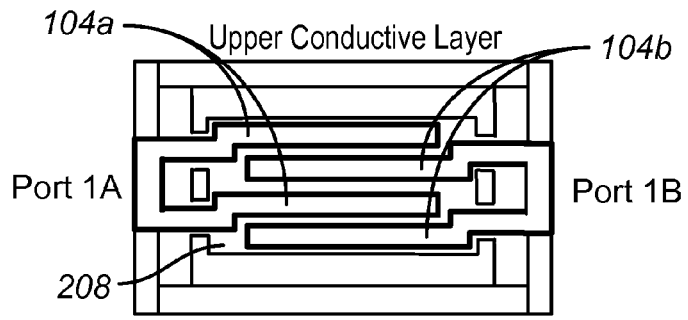
FIG. 2A shows an example of a top view of a CMR device.
Figure 2B:
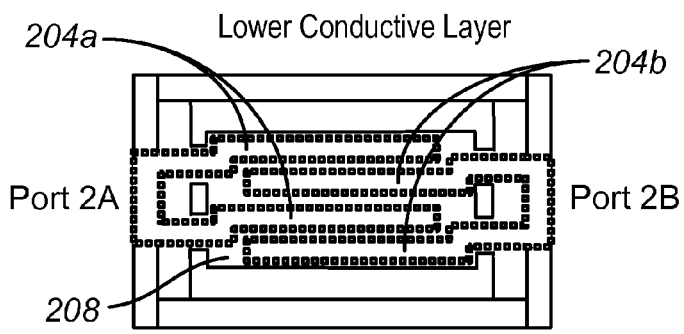
FIG. 2B shows an example of a bottom view of the CMR device of FIG. 2A.
Figure 2C:
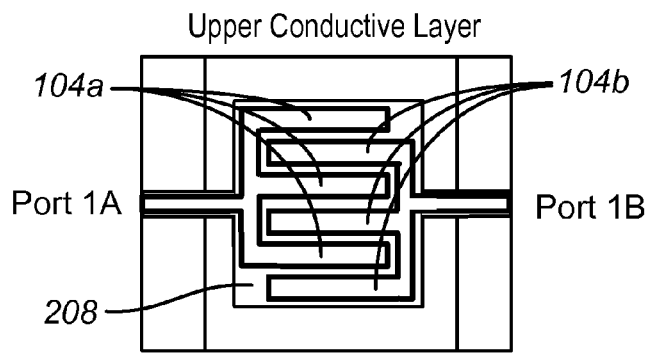
FIG. 2C shows an example of a top view of a CMR device.
Figure 2D:
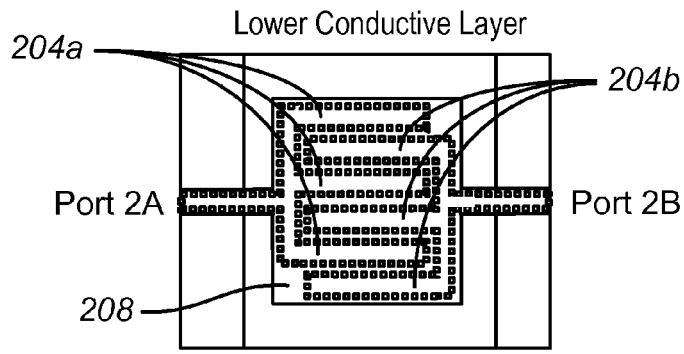
FIG. 2D shows an example of a bottom view of the CMR device of FIG. 2C.

FIG. 2A shows an example of a top view of a CMR device. FIG. 2B shows an example of a bottom view of the CMR device of FIG. 2A. In FIG. 2A, the first electrodes 104a are interdigitated with second electrodes 104b in the upper conductive layer, like the arrangement in FIG. 1. Similarly, as shown in the bottom view of the CMR device in FIG. 2B, the lower conductive layer includes a corresponding arrangement of first electrodes 204a interdigitated with second electrodes 204b. FIG. 2C shows an example of a top view of a CMR device. FIG. 2D shows an example of a bottom view of the CMR device of FIG. 2C. FIGS. 2C and 2D show that there can be additional first and second electrodes in the respective conductive layers, and the electrodes can have different lengths, widths, and spacings from those in FIGS. 2A and 2B. In the examples of FIGS. 2A-2D, the electrodes in the respective conductive layers are situated in a periodic arrangement and spaced apart from one another, for example, along the X axis of FIG. 1. In some examples, the first electrodes 104a and 204a of the respective conductive layers are aligned with one another, that is, along the Z axis of FIG. 1, while separated by piezoelectric layer 208. In such instances, the same can be true for the second electrodes 104b and 204b.

Figure 3:
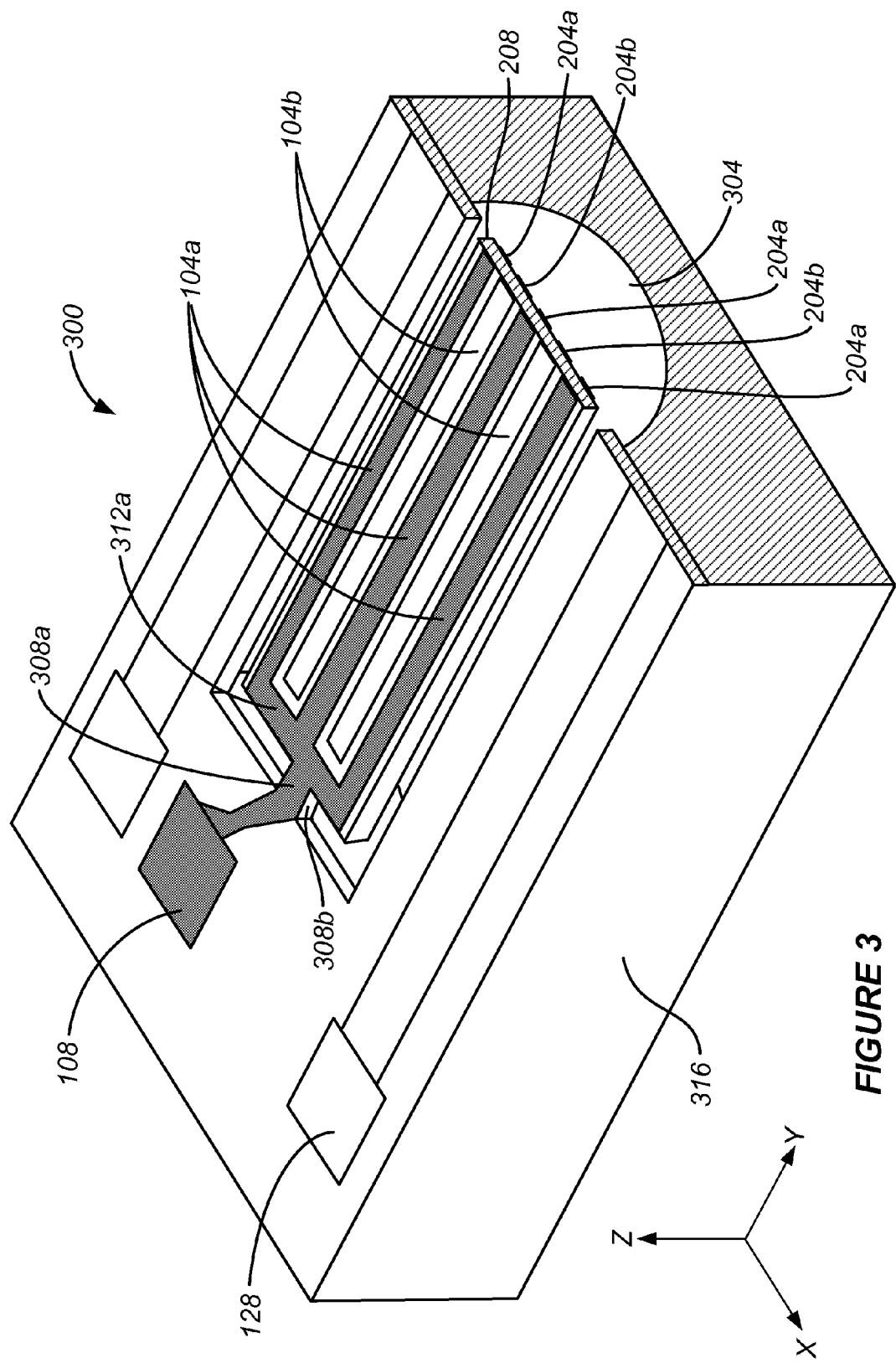
FIG. 3 shows an example of a perspective cross-sectional view of a CMR device.

FIG. 3 shows an example of a perspective cross-sectional view of a CMR device. In FIG. 3, a resonator structure 300 includes an upper conductive layer of electrodes 104a and 104b, piezoelectric layer 208, and lower conductive layer of electrodes 204a and 204b, as described above. The resonator structure 300 is suspended in a cavity 304 by virtue of tethers 308a and 308b, as well as a matching pair of tethers (not shown) connected at the opposite end of the CMR. In FIG. 3, the tethers serve as physical anchors to hold the resonator structure in the cavity. The resonator structure is capable of lateral motion of the piezoelectric material, that is, with respect to a plane oriented along the X and Y axes. The tether 308a is electrically coupled between the first electrodes 104a of the upper conductive layer and port 108, while the tether 308b is electrically coupled between the underlying first electrodes 204a of the lower conductive layer and another port, such as port 116 of FIG. 1. The matching pair of tethers on the opposite end of the structure can similarly electrically couple second electrodes 104b and 204b of the upper and lower layers to their respective ports as described in the example of FIG. 1 above. The tethers can be fabricated as extensions of their respective conductive layers and can be on the order of several microns wide, e.g., along the X axis. In some implementations, the tethers 308a and 308b are designed such that their length, e.g., along the Y axis of FIG. 1, is an integer number of resonant quarter wavelengths.

In the examples shown in FIGS. 2C, 2D and FIG. 3, each set of electrodes has an interconnect electrically coupled to a respective tether. For instance, in FIG. 3, interconnect 312a is coupled between the first electrodes 104a and the tether 308a. Thus, in some implementations, the tether 308a, the electrically coupled interconnect 312a, and the first electrodes 104a form an integral part of the upper conductive layer. Another part of the upper conductive layer includes a corresponding tether and interconnect coupled to the second electrodes 104b. The resonator structure is partially surrounded by space in the form of the cavity 304 and is coupled to supporting structure or a substrate 316, which supports the resonator structure, by virtue of the tethers.

In FIGS. 1-3, the resonator structures can include a pattern of metal electrodes in the upper and lower conductive layers that, when provided one or more electrical input signals, causes the piezoelectric layer to have a motional response. The motional response can include a vibrational oscillation along one or more of the X, Y and Z axes. The resonant frequency response of the CMR structure can be controlled according to a periodic arrangement of electrodes in the conductive layers, for instance, by adjusting the width(s) as well as the spacing(s) of the electrodes from one another in a conductive layer, e.g., along the X axis of FIG. 1.

In FIGS. 1-3, the pattern of interdigitated first electrodes and second electrodes of a conductive layer is periodic in one direction, for instance, along the X axis of FIG. 1. As illustrated, the periodic arrangement of electrodes 104a and 104b includes alternating areas of metal and spaces (areas without metal). In various implementations, the areas of metal and the spaces have the same width, the areas of metal are wider than the spaces, the areas of metal are narrower than the spaces, or any other appropriate relation between the metal widths and spaces. The finger width of the CMR, a parameter that is based on a combination of electrode width and spacing, as described in greater detail below with reference to FIG. 4, can be adjusted to control one or more resonant frequencies of the structure. For instance, a first finger width in a conductive layer can correspond to a first resonant frequency of the CMR, and a second finger width in the conductive layer can provide a different second resonant frequency of the CMR.

The CMR structure can be driven into resonance by applying a harmonic electric potential that varies in time across the patterned conductive layers. The layout and interconnectivity of the periodic electrodes transduce the desired mode of vibration while suppressing the response of undesired spurious modes of vibration of the structure. For example, a specific higher order vibrational mode can be transduced without substantially transducing other modes. Compared to its response to a constant DC electric potential, the amplitude of the mechanical response of the resonator is multiplied by the Q factor (the typical Q factor is on the order of 500 to 5000). Engineering the total width of the resonator structure and the number of electrode periods provides control over the impedance of the resonator structure by scaling the amount of charge generated by the motion of the piezoelectric material.

Figure 4:
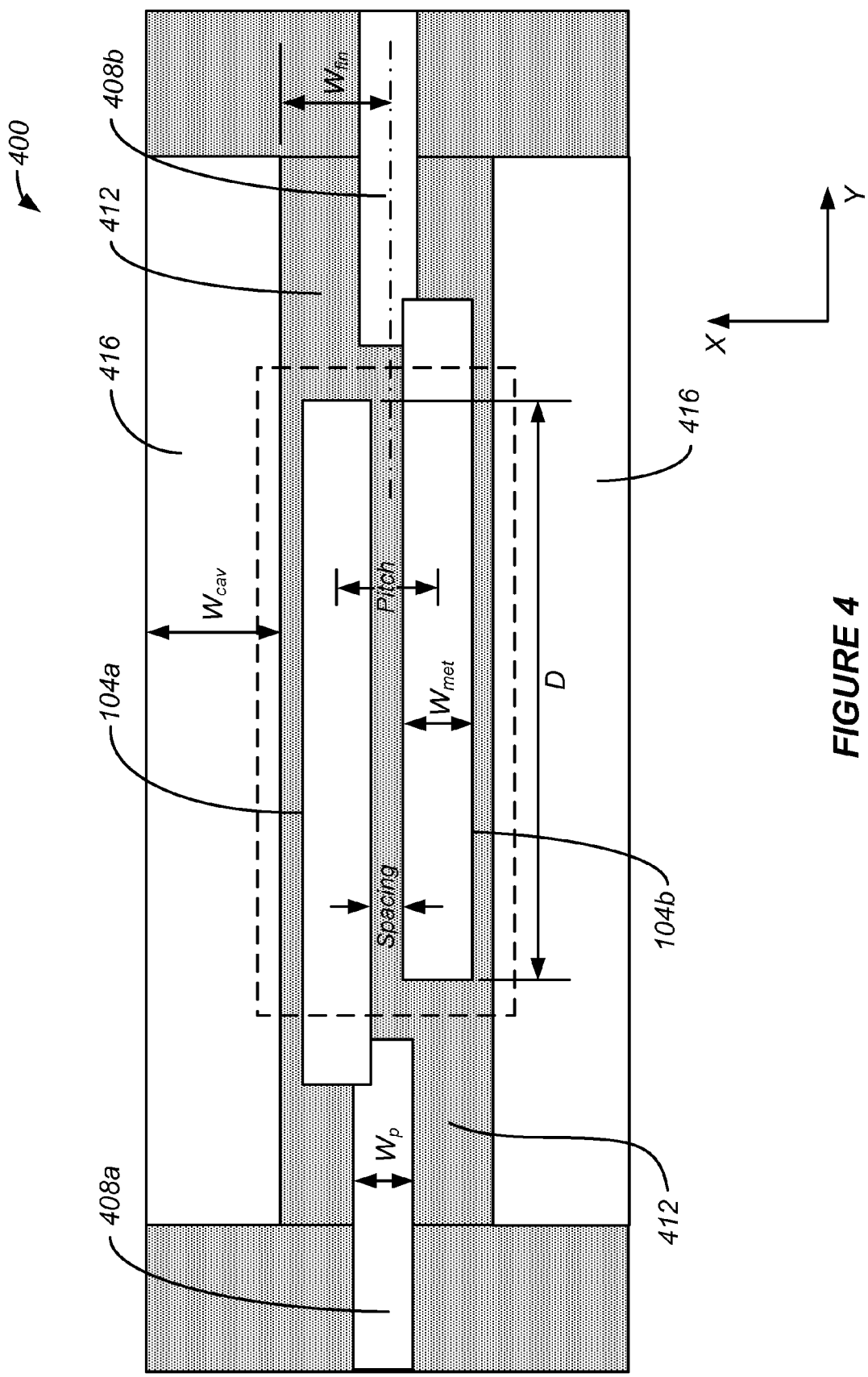
FIG. 4 shows an example of a top view of a resonator device.

FIG. 4 shows an example of a top view of a resonator device in accordance with one implementation. In the implementation of FIG. 4, a resonator structure 400 is configured as a CMR, with the electrodes in the respective conductive layers having longitudinal axes substantially parallel to one another and extending along the Y axis, as illustrated. A resonator structure generally has a finger width, Wfin, representing the width of each sub-resonator, which primarily includes one electrode and half of the width of the exposed piezoelectric material on either side of the one electrode along the X axis, for example, as shown in FIG. 4. The electrode width, that is, the width of an individual electrode, Wmet, is generally smaller than the finger width, to limit the feed-through capacitance between electrodes. The pitch of the resonator structure generally refers to the distance between mid-points of electrodes along the X axis, as shown in FIG. 4. The spacing of electrodes refers to the gap between the edges of adjacent electrodes along the X axis, as shown in FIG. 4. The resonant frequency of the resonator structures disclosed herein is primarily determined by the finger width or pitch. The electrode width and spacing have second-order effects on the frequency. The finger width and pitch are correlated with the electrode width and spacing parameters, by definition. Pitch is often equal to finger width, as shown in FIG. 4.

In FIG. 4, in one example, the upper electrodes 104a and 104b have an electrode width along the X axis, Wmet, of 4.8 um. Connecting members 408a and 408b, which can include tethers in one example, are coupled to the respective electrodes 104a and 104b. The connecting members 408a and 408b have a connecting member width, Wp, which can be smaller than Wmet in this example. In other instances, Wp is the same size or larger than Wmet, depending on the desired configuration. The finger width of the electrodes, Wfin, which corresponds to the half-width of the piezoelectric layer 412 in this example, is 6.4 um. Wcav, the cavity width of cavity 416 along the X axis can be an integer multiple of Wfin, such as 2*Wfin (e.g., 12.8 um) or other measurement. Thus, in this instance, Wcav is approximately the same as the full piezoelectric layer width. In this example, a distance D, in which the upper electrodes 104a and 104b are adjacent to one another, can be on the order of 128 um or 256 um, by way of example.

Figure 5:
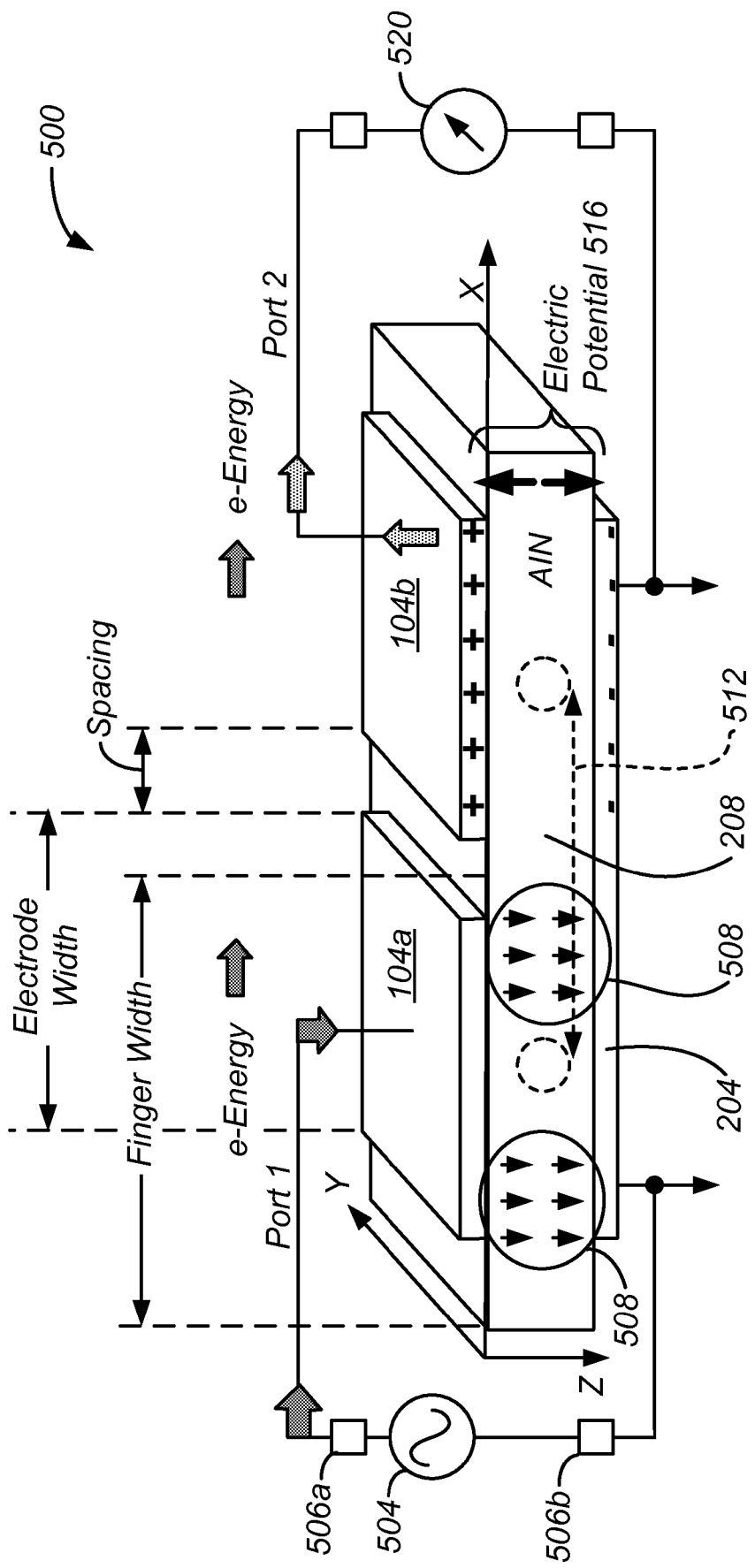
FIG. 5 shows an example of a perspective cross-sectional view of a resonator structure.

FIG. 5 shows an example of a perspective cross-sectional view of a resonator structure. In FIG. 5, the resonator structure 500 includes an upper conductive layer of electrodes 104a and 104b, a piezoelectric layer 208, and a lower conductive layer in the form of a single electrode 204, with the layers stacked as described above. In FIG. 5, there is an input port, "Port 1," at which an input electrical signal can be delivered to first electrode 104a of the upper conductive layer. Port 1 can be coupled to receive the input electrical signal from various components, such as an amplifier or an antenna. In the illustration of FIG. 5, an alternating current (AC) current source 504 simulates the electrical signal delivered by such a component. The AC current source 504 has a first terminal 506a coupled to Port 1 and a second terminal 506b coupled to the lower electrode 204, which is coupled to ground in this example. In this way, an input AC signal can be provided from current source 504 to Port 1 and, hence, to first electrode 104a of the resonator. This causes an electric field caused by an alternating current to be applied across the thickness of the piezoelectric layer 208, illustrated by arrows 508 in FIG. 5. The thickness of the structure 500 is generally measured along the Z axis, and the length is measured along the Y axis. The total width, also referred to herein as the width of the structure, finger width, spacing, and electrode width are measured along the X axis, in the example of FIG. 5. The electric field 508 is applied in a manner to transduce mechanical resonance such that piezoelectric layer 208 experiences displacement back and forth along the X, Y and Z axes. This includes lateral displacement, that is, back and forth along the width and length of the structure, in this example, substantially along the respective X and Y axes of FIG. 5.

FIG. 5 illustrates a two-port structure with the second electrode 104b coupled to Port 2, which represents an output port in this configuration. Some of the present CMR implementations leverage the lateral movement substantially back-and-forth along the width of the structure (X axis) as illustrated by arrows 512, although the transduction of energy in other implementations can be based on movement along the length and/or thickness of the structure. The piezoelectric layer 208 of the disclosed resonators can vibrate and move in all dimensions at resonant frequencies, for instances, in planes oriented along the X and Y axes, X and Z axes, and Y and Z axes. In one example of a CMR, the electric field 508 is induced across piezoelectric layer 208 along the Z axis, causing extensional mechanical stress 512 in the piezoelectric layer along the width of the structure through piezoelectric mechanical coupling. This mechanical energy causes an electric potential 516 to be generated across second electrode 104b and lower electrode 204. This transduced potential is sensed as an output electrical signal at Port 2 and can be measured by one or more sensors 520 coupled between Port 2 and the grounded lower electrode 204.

The fundamental frequency for the displacement of the piezoelectric layer can be set in part lithographically by the planar dimensions of the upper electrodes, the lower electrode(s), and/or the piezoelectric layer. For instance, the resonator structures described above can be implemented by patterning the input electrodes and output electrodes of a respective conductive layer symmetrically, as illustrated in FIGS. 1-4. In the examples of FIGS. 1-4, an AC electric field applied across the upper and lower electrodes induces mechanical deformations in one or more planes of the piezoelectric layer via the d31 or d33 coefficient of the piezoelectric material, such as AlN. At the device resonant frequency, the electrical signal across the device is reinforced and the device behaves as an electronic resonant circuit.

In the present implementations, the resonant frequency of a CMR can be directly controlled by setting the finger width, as shown in FIG. 5. One benefit of such a control parameter is that multi-frequency filters can be fabricated on the same chip. CMR 500 has a resonant frequency associated with the finger width, which is based on the spacing in combination with the electrode width of electrodes 104a and 104b, that is, along the X axis. The finger width in a conductive layer of the CMR structure can be altered to adjust the resonant frequency. The resonant frequency is generally lowered as the finger width increases.

The total width, length, and thickness of the resonator structure are parameters that can also be selected. In some CMR implementations, the finger width of the resonator is the main parameter that is controlled to adjust the resonant frequency of the structure, while the total width multiplied by the total length of the resonator (total area) can be set to control the impedance of the resonator structure. In one example, in FIG. 5, the lateral dimensions, i.e., the width and length of resonator structure 500 can be on the order of several 100 microns by several 100 microns for a device designed to operate around 1 GHz. In another example, the lateral dimensions are several 1000 microns by several 1000 microns for a device designed to operate at around 10 MHz. A suitable thickness of the piezoelectric layer can be about 0.01 to 10 microns thick.

The pass band frequency can be determined by the layout of the resonator structure, as can the terminal impedance. For instance, by changing the shape, size and number of electrodes, the terminal impedance can be adjusted. In some examples, longer fingers along the Y axis of FIGS. 1, 4 and 5 yield smaller impedance. This, in turn, is inversely proportional to the capacitance of the CMR. The resonant frequencies of the CMR structures described herein are generally insensitive to the fabrication process, to the extent that the piezoelectric thickness and thicknesses of the conductive layers do not significantly impact the frequency. The impedance and the frequency can be controlled independently, since the length and the width/spacing of electrodes are in perpendicular directions.

Figure 6:
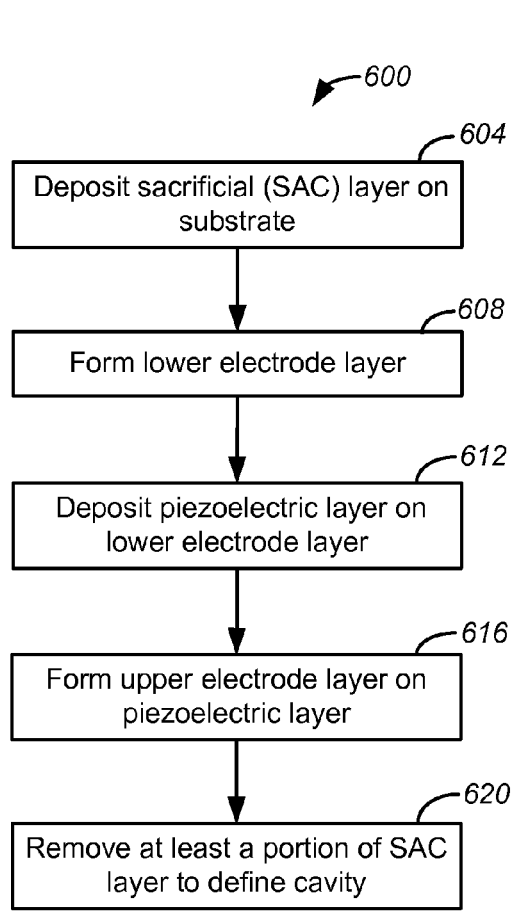
FIG. 6 shows an example of a flow diagram illustrating a process for forming a resonator structure.

FIG. 6 shows an example of a flow diagram illustrating a process for forming a resonator structure. In FIG. 6, the process 600 begins in block 604 in which a sacrificial (SAC) layer is deposited on a substrate. The SAC layer can have various shapes and sizes, and can be shaped to cover all or some portion of the substrate, depending on the desired implementation. In block 608, a lower electrode layer is formed on the SAC layer. The lower electrode layer is made of a conductive material such as metal and can be patterned to define one or more electrodes, depending on the desired configuration. When more than one electrode is defined, the electrodes can be connected at separate ports of the resonator device. In block 612, a piezoelectric layer is deposited on the lower electrode layer. In block 616, an upper electrode layer is then formed on the piezoelectric layer. The upper electrode layer also can be patterned to define more than one electrode. In some implementations, overlaying groups of electrodes can be defined in the upper and lower electrode layers on opposite surfaces of the piezoelectric layer. In block 620, part or all of the SAC layer is removed to define a cavity beneath the resonator structure.

Figure 7:
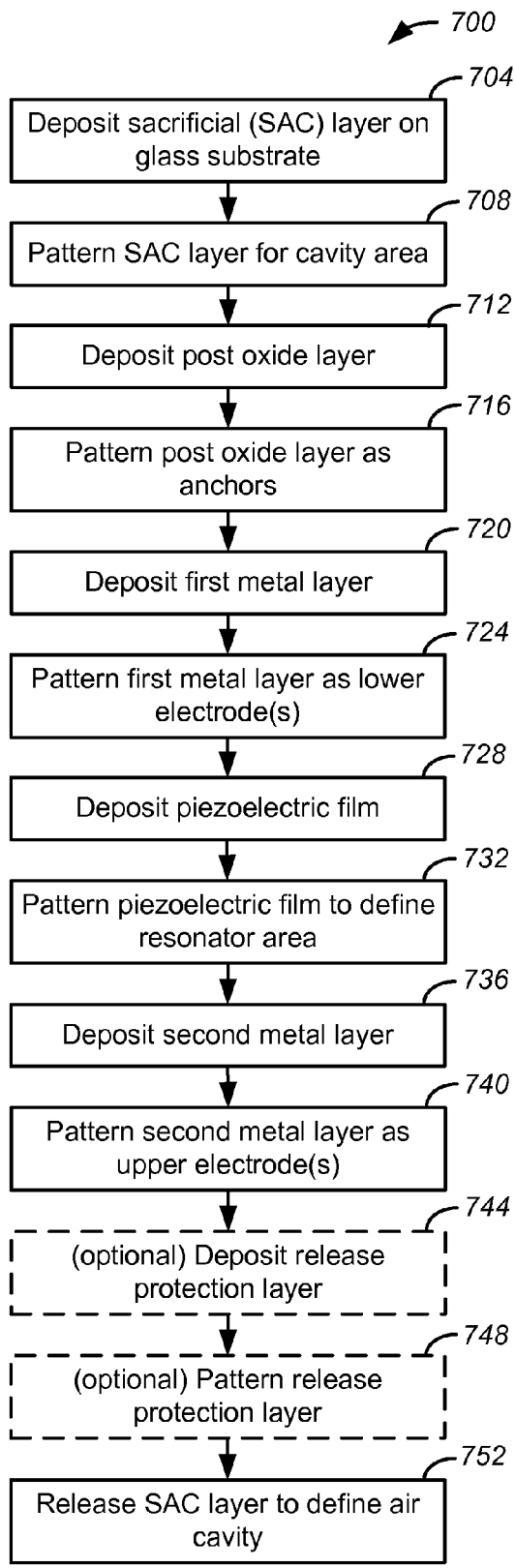
FIG. 7 shows an example of a flow diagram illustrating a process for forming a staggered resonator structure.

FIG. 7 shows an example of a flow diagram illustrating a process for forming a staggered resonator structure. FIGS. 8A-8G show examples of cross-sectional schematic illustrations of stages of staggered resonator fabrication in accordance with a process, for instance, as represented in FIG. 6 or FIG. 7. FIGS. 9A-9G show examples of perspective views of stages of staggered resonator fabrication in accordance with a process, for instance, as represented in FIG. 6 or FIG. 7.

Figure 8A:
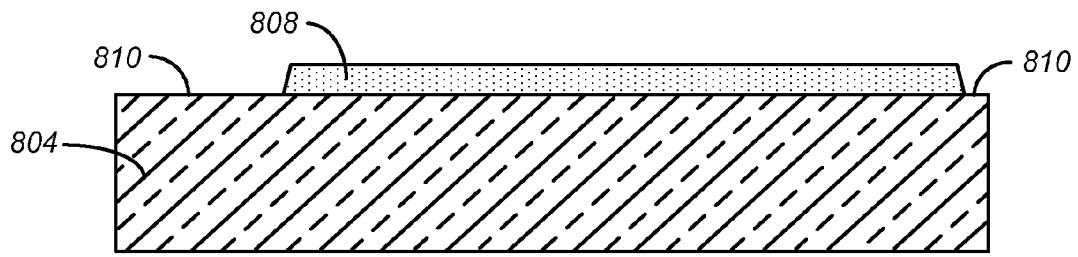
FIGS. 8A-8G show examples of cross-sectional schematic illustrations of stages of staggered resonator fabrication in accordance with a process, for instance, as represented in FIG. 6 or FIG. 7.
Figure 8B:
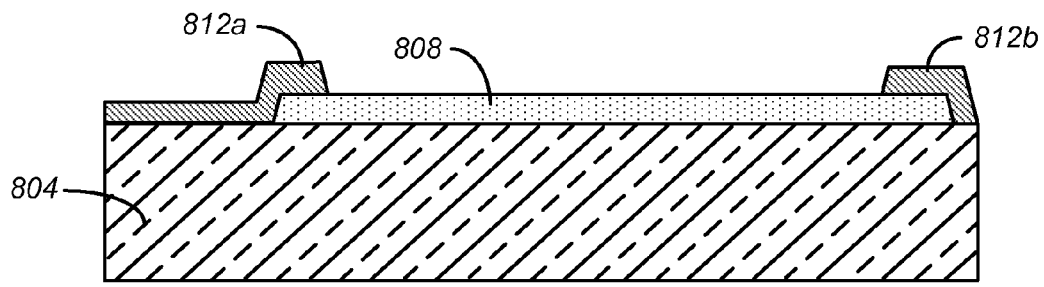
Figure 8C:
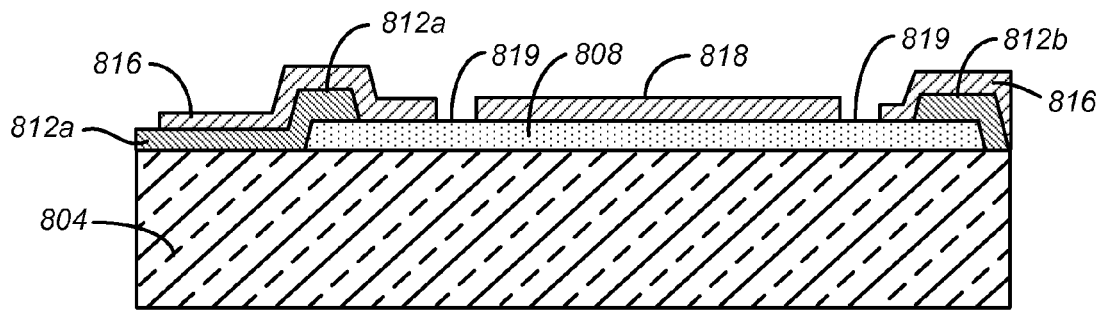
Figure 8D:
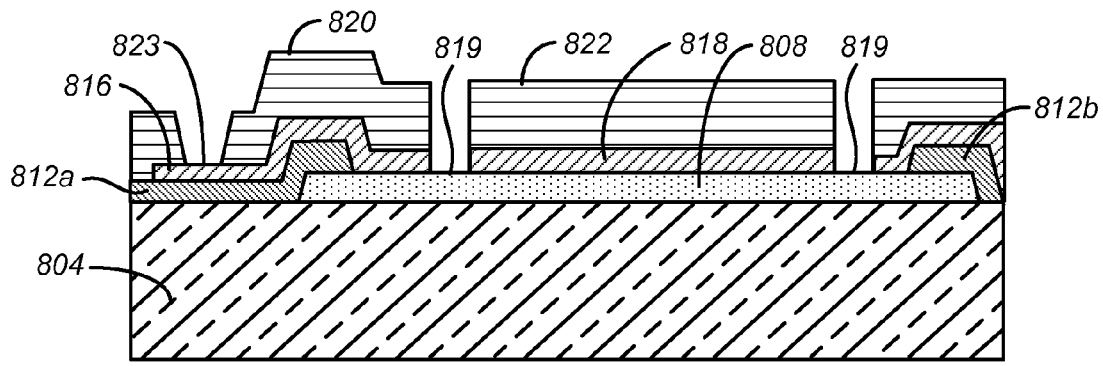
Figure 8E:
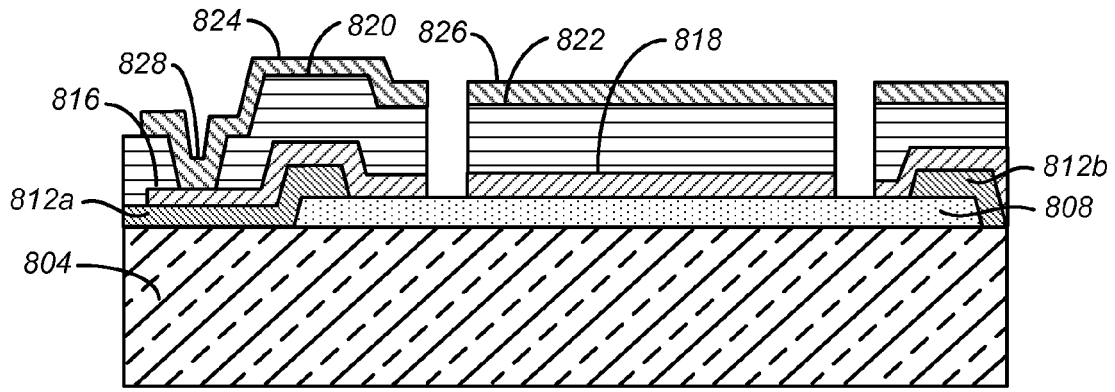
Figure 8F:
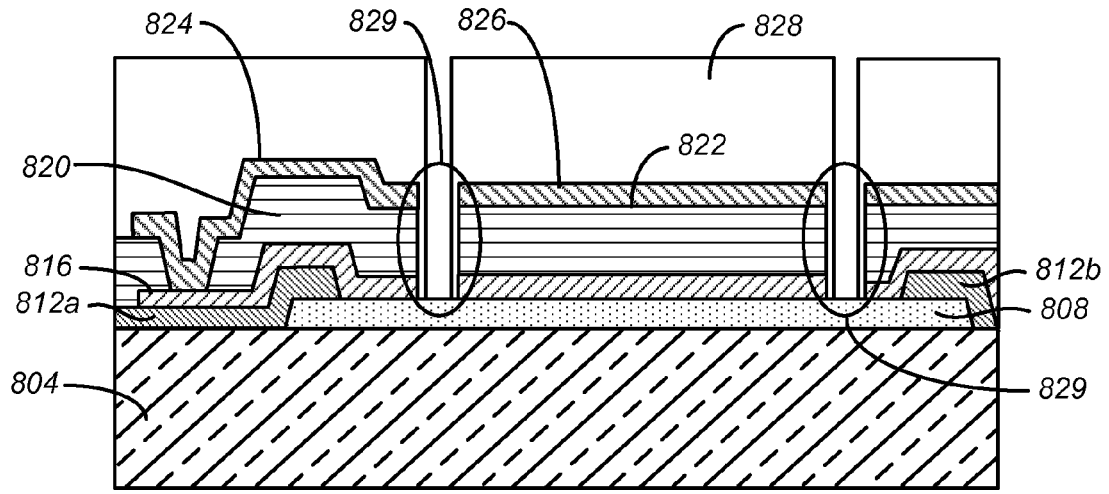
Figure 8G:
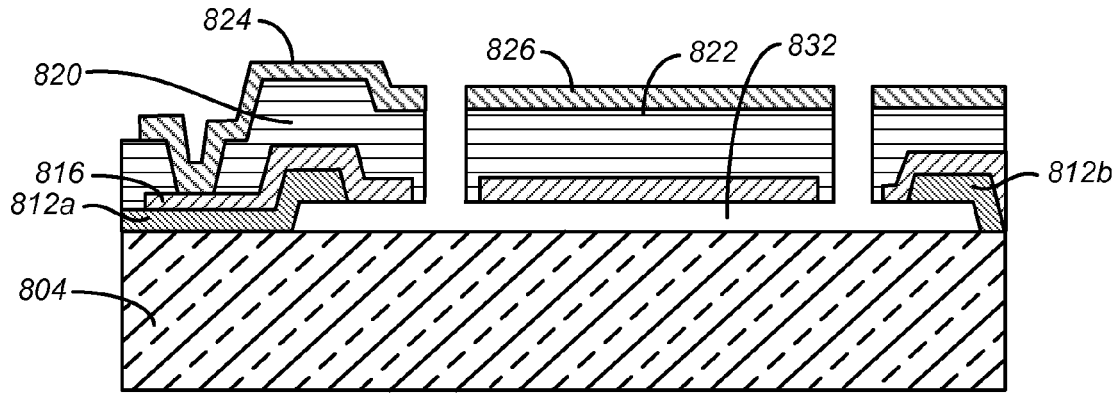
Figure 9A:
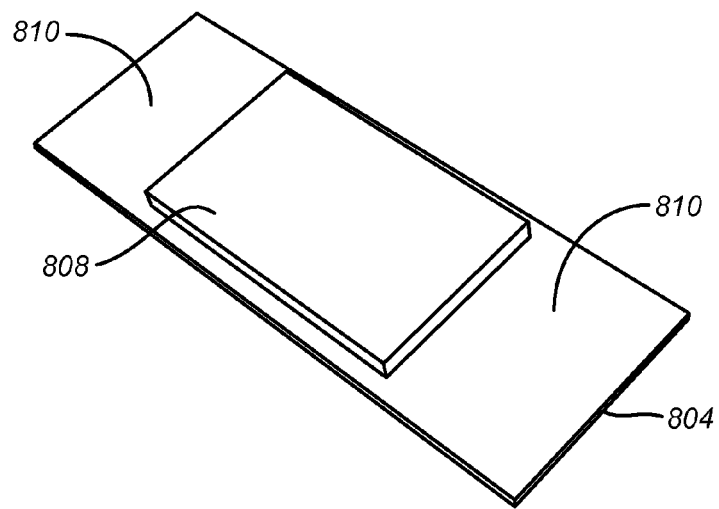
FIGS. 9A-9G show examples of perspective views of stages of staggered resonator fabrication in accordance with a process, for instance, as represented in FIG. 6 or FIG. 7.

In FIG. 7, the process 700 begins in block 704 in which a SAC layer 808 is deposited on a glass substrate 804, as shown in FIGS. 8A and 9A. To form the staggered structure of FIGS. 8 and 9, in block 708, SAC layer 808 is patterned using an appropriately shaped and aligned mask such that SAC layer 808 overlays a portion of substrate 804 and exposes end portions 810 of the surface of substrate 804 on respective ends of SAC layer 808. The SAC layer 808 defines a region in which a cavity will be formed to substantially isolate the resonator structure from the substrate 804, as further described below. The SAC layer 808 can be formed of silicon oxynitride (SiON), silicon oxide (SiOx), molybdenum (Mo), germanium (Ge), amorphous silicon (a-Si), poly-crystalline silicon, and/or various polymers, for example. In some implementations of the process 700, a suitable thickness of SAC layer 808 is in the range of about 0.5 micrometers (um) to 3 um. In one example, SAC layer 808 is formed of Mo and has a thickness of about 0.5 um.

Figure 9B:
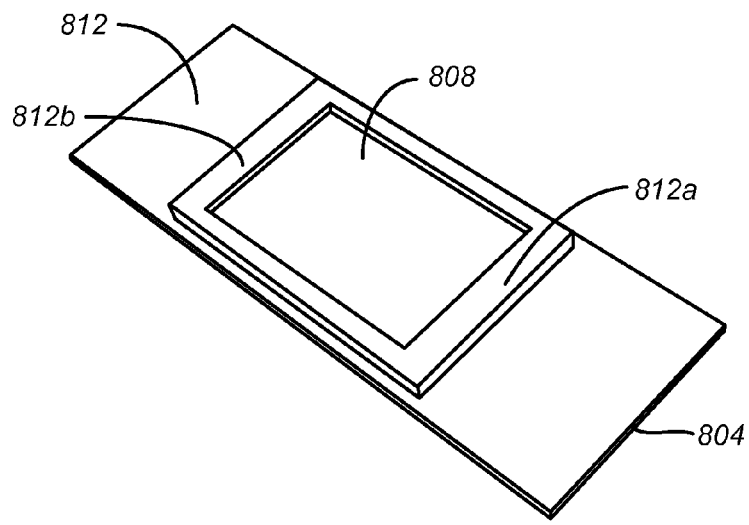

In block 712, a post oxide layer 812 is deposited over SAC layer 808 and exposed surface portions 810 of glass substrate 804. In block 716, to form the staggered structure of FIGS. 8 and 9, the post oxide layer 812 is patterned using an appropriate mask to expose a top portion of the sacrificial layer 808, as shown in FIGS. 8B and 9B. The remaining portions 812a and 812b of the post oxide layer define anchor structures on sides of the structure, as shown in FIGS. 8B and 9B, covering surface portions 810 of substrate 804. The post oxide layer 812 can be formed of materials such as SiOx and SiON and have a thickness, for example, on the order of about 1 um to 3 um. In some other implementations, post oxide layer 812 can be formed of nickel silicide (NiSi) or molybdenum silicide (MoSi$_2$). In some examples, post oxide layer 812 is about 0.5 um, or can be thicker, in the range of about 3 um to 5 um.

Figure 9C:
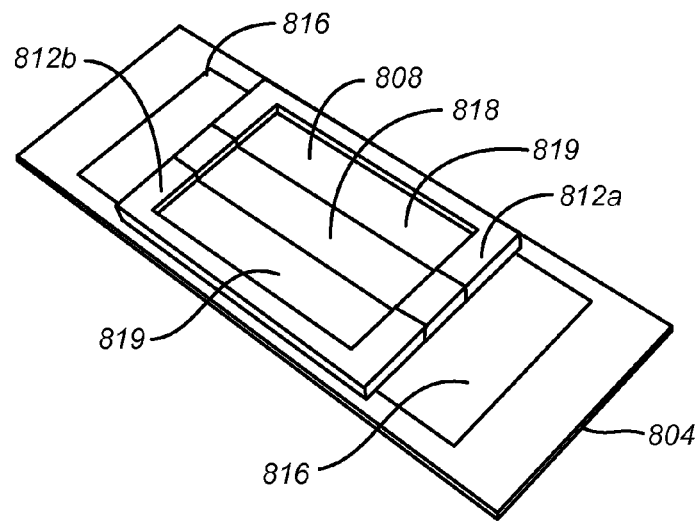
Figure 9D:
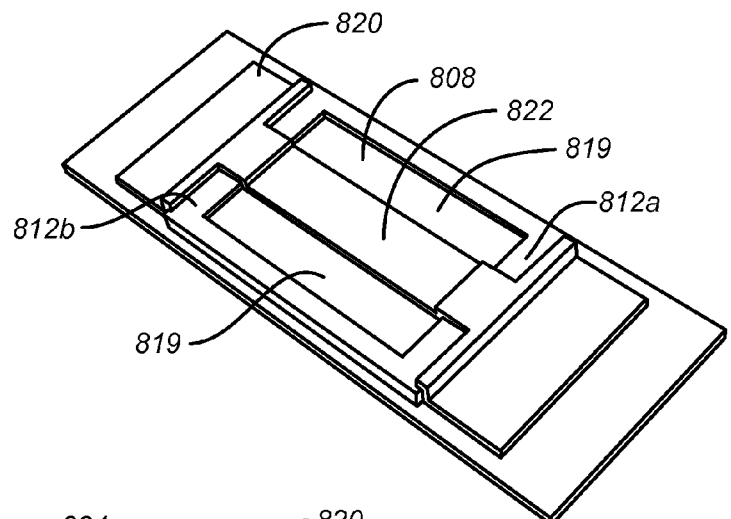

In block 720, a first metal layer 816 is deposited such that it overlays the post oxide anchors 812a and 812b as well as the exposed region of SAC layer 808. Metal layer 816 can be formed of aluminum (Al), Al/titanium nitride (TiN)/Al, aluminum copper (AlCu), Mo, or other appropriate materials, and have a thickness of 750 to 3000 Angstroms depending on the desired implementation. In some cases, the metal layer 816 is deposited as a bi-layer with a metal such as Mo deposited on top of a seed layer such as AlN. An appropriate thickness for the seed layer can be, for example, 100 to 1000 Angstroms. When Mo is used, the total thickness of the metal layer 816 can be about 3000 Angstroms. Other suitable materials for metal layer 816 include aluminum silicon (AlSi), AlCu, Ti, TiN, Al, platinum (Pt), nickel (Ni), tungsten (W), ruthenium (Ru), and combinations thereof. Thicknesses can range from about 0.1 um to 0.3 um, depending on the desired implementation. As shown in FIGS. 8C and 9C, in block 724, the first metal layer 816 is patterned using, for instance, an appropriate mask to define one or more lower electrodes 818. In some implementations, the one or more lower electrodes can be shaped to match overlaying upper electrodes. In the example of FIGS. 8C and 9C, metal layer 816 is formed to have a single electrode 818 in the shape of a strip, which extends laterally across the SAC layer 808 and exposes the SAC layer 808 on sides 819 of the strip, as shown in FIG. 9C. The exposed areas 819 of the SAC layer 808 in FIG. 9C are shown as vias in the cross section depicted by FIGS. 8C-8G, for purposes of illustration.

In block 728, a piezoelectric layer, e.g., film 820, is deposited on the structure. In block 732, the piezoelectric film 820 is patterned using an appropriate mask such that strip 822 of the piezoelectric film 820 directly overlays the lower electrode portion 818, shown in FIGS. 8D and 9D. Again, as with the deposition and formation of the lower electrode layer 818, side areas 819 of the SAC layer 808 remain exposed from above. The piezoelectric layer can be formed of AlN and have a thickness, for example, between about 1 um and 2 um. In one example, an AlN piezoelectric film has a thickness of about 1.2 um. Piezoelectric film 820 is patterned at one end of the structure to have one or more vias 823, exposing a portion of the first metal layer 816 for conductive contact to be made to the first metal layer 816, as shown in FIG. 8D.

Figure 9E:
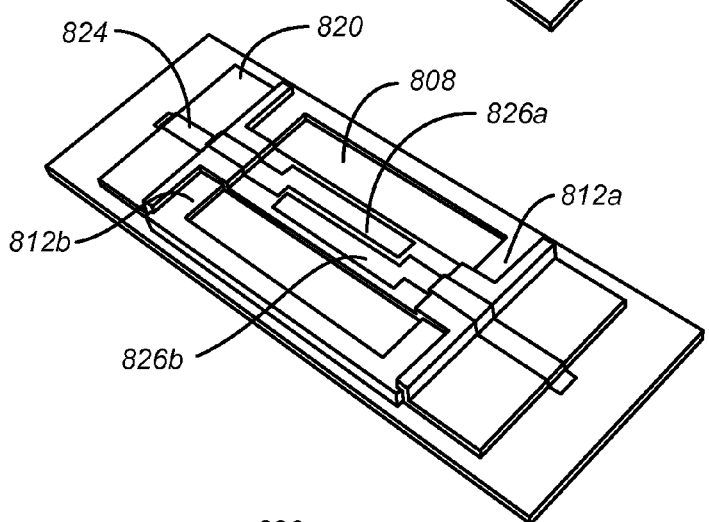

In FIG. 7, a second metal layer 824 is deposited and patterned, in blocks 736 and 740, to define upper electrodes 826, as shown in FIGS. 8E and 9E. The second metal layer 824 can be formed of AlCu, for example, as well as other materials as described above for forming the first metal layer 816. In one example, the second metal layer 824 is formed of AlCu, and has a thickness of about 2000 Angstroms. Other suitable thicknesses range from about 0.1 um to 0.3 um. As illustrated in FIG. 9E, when second metal layer 824 is patterned, in some implementations, a pair of adjacent electrodes 826a and 826b is formed. In one implementation, the electrodes 826a and 826b have longitudinal axes extending along the structure from opposite ends, as shown in FIG. 9E. Thus, the respective electrodes 826a and 826b can be connected to different ports, depending on the desired configuration of input and output signals using the resonator structure. In some implementations, a contact region 828 of the second metal layer 824 can be deposited in via 823 so the first and second metal layers are in conductive contact with one another.

Following the formation of the second metal layer 824, a release protection layer 828 such as AlOx can be deposited in block 744 using atomic layer deposition (ALD), physical vapor deposition (PVD), or other appropriate techniques and patterned in block 748 to protect sidewalls 829 of the electrodes in the first and second metal layers 816 and 824 and the sandwiched piezoelectric layer 820, as shown in FIG. 8F. Blocks 744 and 748 of FIG. 7 can be omitted in some implementations. In some implementations, the release protection layer 828 is patterned in block 748 to overlay the second metal layer 824, as shown in FIG. 8F. The side areas 819 remain exposed. The release protection layer 828 can be formed of SiON, and have a thickness of about 5000 Angstroms. The release protection layer 828 can then be removed after release of the SAC layer 808.

Figure 9F:
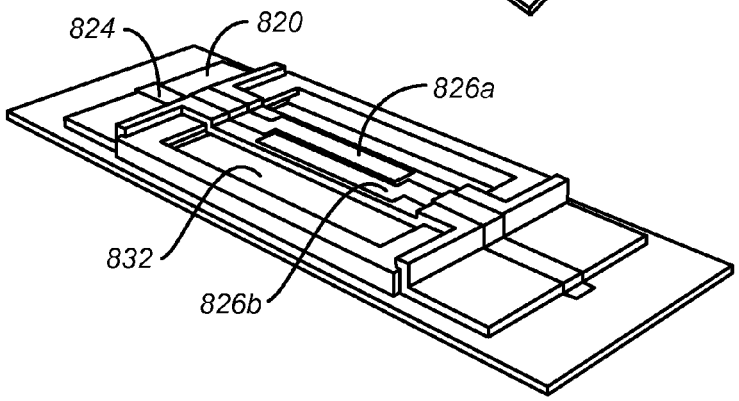
Figure 9G:
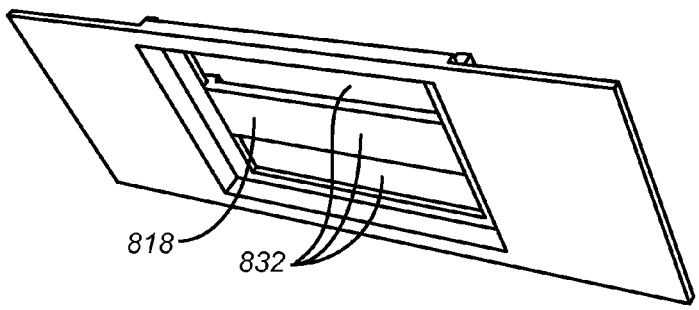

In block 752, the SAC layer 808 is then removed to define an air cavity 832, as shown in FIGS. 8G and 9F. In some implementations, the SAC layer 808 is released by exposing the structure to XeF$_2$ gas or SF$_6$ plasma, for instance, when the SAC layer 808 is formed of Mo or a-Si. HF can be used when the SAC layer 808 is formed of SiON or SiOx. FIG. 9G shows a perspective back view of the resulting resonator structure, with substrate 804 not shown to better illustrate cavity 832. The cavity 832 region is essentially defined by the absence of the SAC layer 808; thus, the cavity 832 includes side areas 819 and a portion underlying the first metal strip 818 of the resonator.

Following block 752, a metal interconnect layer can be deposited and patterned outside of the resonator structure to define transmission lines to the first and second metal layers 816 and 824. AlSi, AlCu, plated Cu, or other appropriate material can be used to form the metal interconnect layer.

Figure 10:
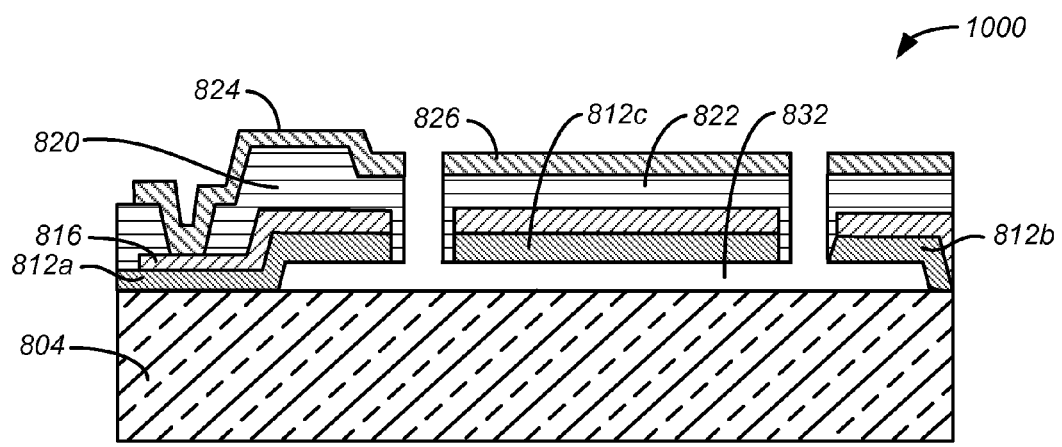
FIG. 10 shows an example of a cross-sectional schematic illustration of a temperature-compensated resonator structure.

FIG. 10 shows an example of a cross-sectional schematic illustration of a temperature-compensated resonator structure. The temperature compensated structure 1000 of FIG. 10 can be fabricated using the same processes as described above with respect to FIGS. 7-9, with a slight variation. Here, the post oxide layer 812 is patterned in block 716 such that a strip of the post oxide layer 812c remains and underlies the lower electrode(s) 818. In some implementations, the post oxide strip 812c is aligned with the overlaying lower electrode 818, the piezoelectric layer 822, and the upper electrodes 826 of the resonator structure. This strip 812c defines a temperature compensation layer for the resonator structure. The thickness of the post oxide layer 812 as a temperature compensation layer is often dependent on the choice of materials for the piezoelectric and electrode layers. In one case where the piezoelectric material is AlN, the electrodes are AlCu, Mo or a combination of both, and the post oxide layer is SiO2, the thickness for the SiO2 layer is of comparable magnitude to the thickness of the AlN layer.

In FIG. 10, the temperature compensation layer 812c provides resonators with a lower magnitude temperature-coefficient of frequency (TCF). This can be achieved by the selection of an appropriate material and layer thicknesses, as described above, for the post oxide layer 812, which serves as the thin-film compensation layer.

Figure 11:
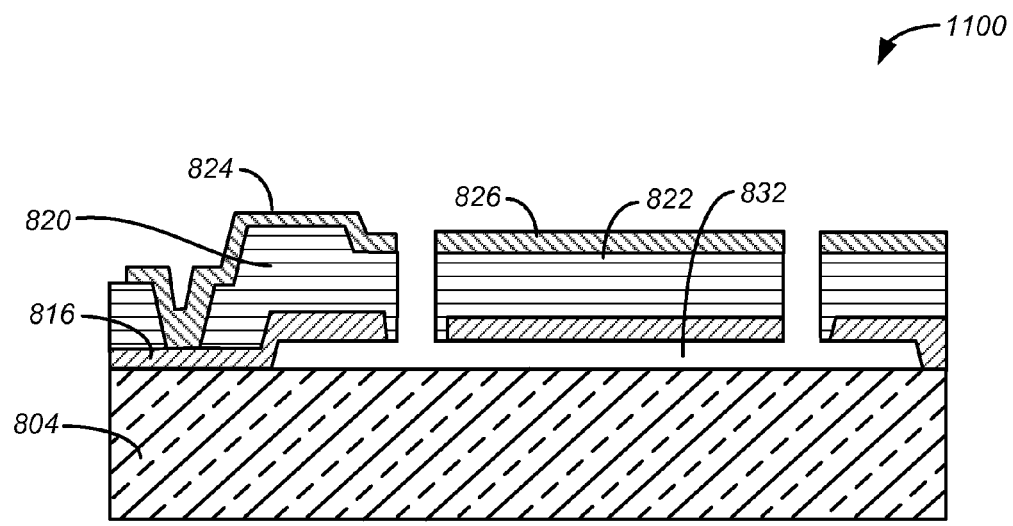
FIG. 11 shows an example of a cross-sectional schematic illustration of an airgap resonator structure.

FIG. 11 shows an example of a cross-sectional schematic illustration of an airgap resonator structure. The airgap structure 1100 of FIG. 11 also can be fabricated using essentially the same processes as described above with respect to FIGS. 7-9. Here, blocks 712 and 716 have been omitted, so that no post oxide layer is formed. The lower electrode layer is thus deposited and patterned in blocks 720 and 724 so that it directly overlays the SAC layer 808 and the exposed areas 810 of the substrate 804. The remaining fabrication blocks can be performed as described above with respect to FIGS. 7-9.

The piezoelectric materials that can be used in fabrication of the piezoelectric layers of electromechanical systems resonators disclosed herein include, for example, aluminum nitride, zinc oxide, gallium arsenide, aluminum gallium arsenide, gallium nitride, quartz and other piezoelectric materials such as zinc-sulfide, cadmium-sulfide, lithium tantalate, lithium niobate, lead zirconate titanate, members of the lead lanthanum zirconate titanate family, doped aluminum nitride (AlN:Sc), and combinations thereof. The conductive layers of upper and lower electrodes may be made of various conductive materials including platinum, aluminum, molybdenum, tungsten, titanium, niobium, ruthenium, chromium, doped polycrystalline silicon, doped AlGaAs compounds, gold, copper, silver, tantalum, cobalt, nickel, palladium, silicon germanium, doped conductive zinc oxide, and combinations thereof. In various implementations, the upper metal electrodes and/or the lower metal electrodes can include the same conductive material(s) or different conductive materials.

Figure 12:
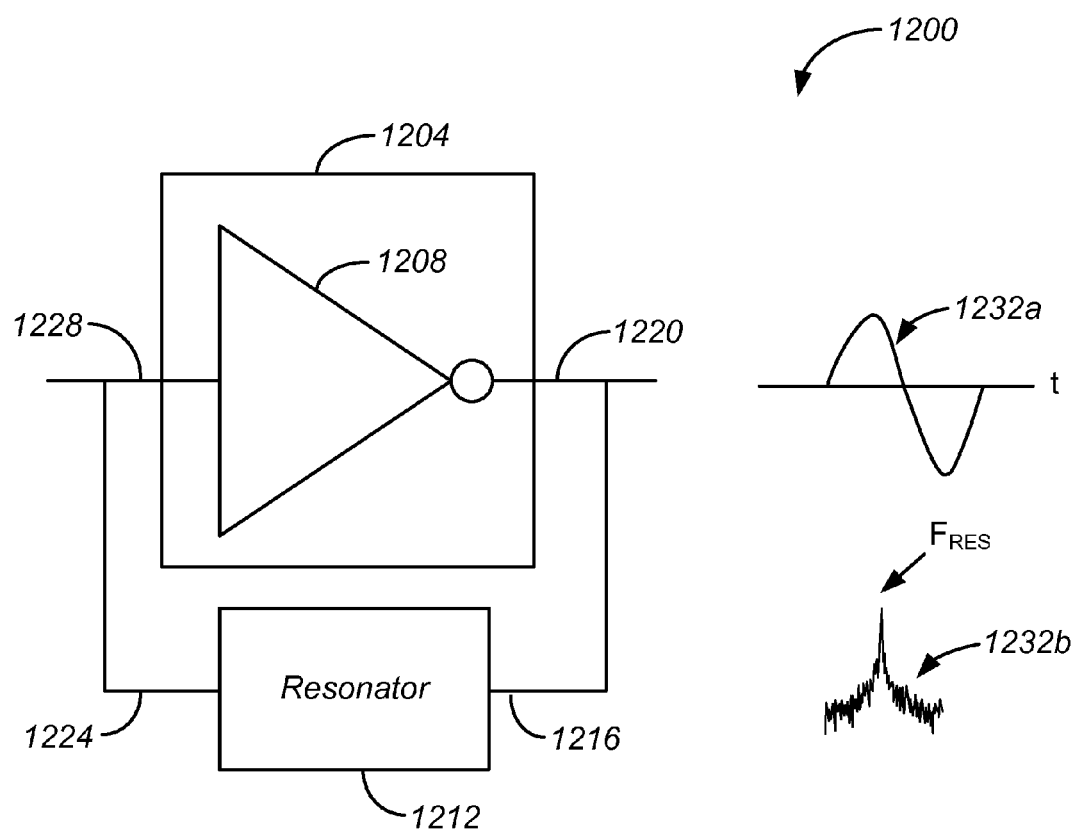
FIG. 12 shows an example of a system block diagram of an electronic oscillator incorporating a resonator such as a CMR.

FIG. 12 shows an example of a system block diagram of an electronic oscillator 1200 incorporating a resonator such as a CMR. The oscillator 1200 includes an active component 1204 such as an amplifier 1208 and a passive electrical resonator component 1212 incorporating one or more resonator structures as described above. Active component 1204 can include one or more various active elements and circuits, such as diodes and/or transistors. An input 1216 of the passive resonator component 1212 is connected to an output 1220 of the active component 1204, and an output 1224 of the resonator component 1212 is connected to an input 1228 of the active component 1204, so resonator component 1212 feeds back to the active component input 1228. Over time, white noise sensed at node 1228 will cause the oscillator 1200 to oscillate. In the example of a single resonant frequency $F_{RES}$ output from the resonator component 1212, the resulting output signal at node 1220 is a single-frequency sinusoidal signal illustrated in the time domain by reference numeral 1232a and, in the frequency domain, as frequency response 1232b, as shown in FIG. 12. The resonant frequency of the oscillator 1200 is indicated in response 1232b as $F_{RES}$.

Figure 13:
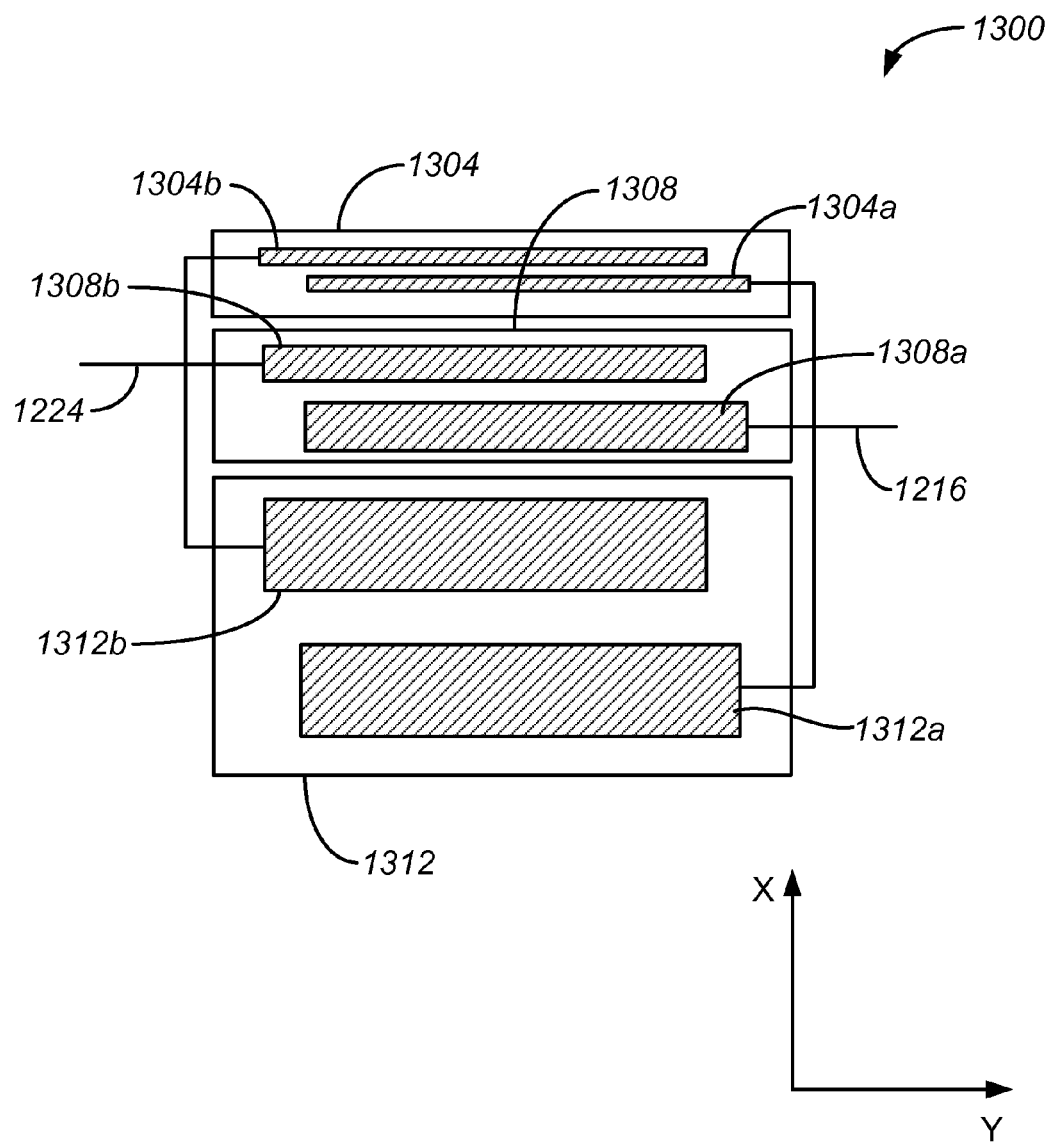
FIG. 13 shows an example of a block diagram of a resonator component incorporating three resonators.

In FIG. 12, the resonator component 1212 can be constructed to include a single resonator in some implementations, or two or more resonators in some other implementations. For instance, FIG. 13 shows an example of a block diagram of a resonator component 1300 incorporating three resonators. The resonators 1304, 1308, and 1312 are connected in parallel as illustrated. In this example, each resonator is a CMR with at least a first electrode and a second electrode having respective lengths and widths as explained above with reference to at least FIG. 2 and FIG. 4. For purposes of illustration only, the resonators 1304, 1308, and 1312 are represented in FIG. 13 as each incorporating a respective first electrode 1304a, 1308a, and 1312a, and a respective second electrode 1304b, 1308b, and 1312b. Each resonator 1304, 1308, and 1312 can be constructed in the manners described above in which one or more first electrodes of the resonator are connected to an input port, such as input 1216 of FIG. 12, and one or more second electrodes are connected to an output port, such as output 1224 of FIG. 12.

In FIG. 13, the resonators 1304, 1308, and 1312 are illustrated as discrete components, for purposes of illustration. However, from a fabrication point-of-view, these resonators can be fabricated on the same or different wafers. For example, several resonators can be fabricated using the same piezoelectric film on the same die. Thus, a multi-frequency bank of resonators as shown in FIG. 13 can be fabricated as an integral unit.

The disclosed oscillators can incorporate one or more resonators, such as CMRs, to generate the resonant frequencies of a desired signal form, such as a square wave signal. That is, the resonator(s) can be configured so the output resonant frequencies of the oscillator can be synthesized to produce the desired signal. In FIG. 13, the resonator 1300 is a bank of individual resonators 1304, 1308, and 1312, each configured to have a different resonant frequency. In the illustrated example, the widths and spacings of electrodes in the respective resonators 1304, 1308, and 1312, that is, along the X axis, are different from one another and are selected to produce the desired resonant frequency of each resonator. Other parameters as described above, such as total width of each resonator, can be engineered to control its resonant frequency.

Figure 14:
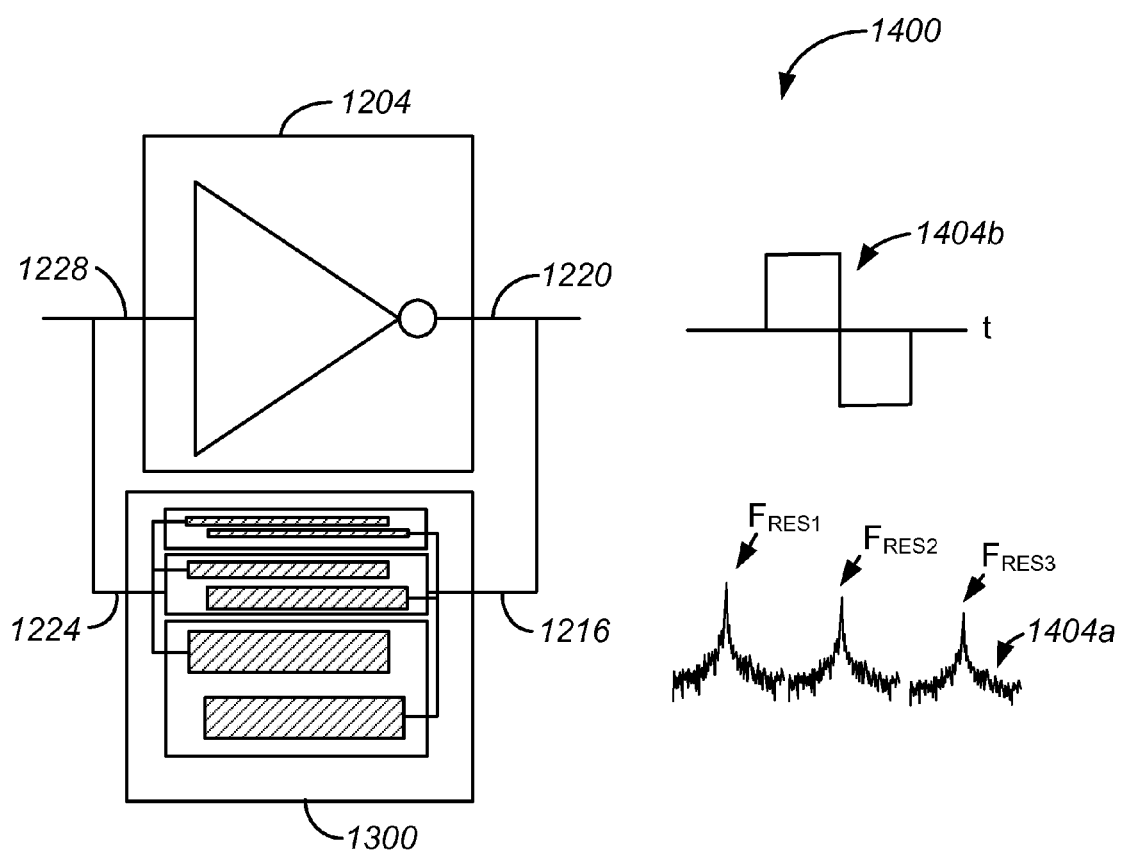
FIG. 14 shows an example of a system block diagram of an electronic oscillator with a resonator component including three resonators.

FIG. 14 shows an example of a system block diagram of an electronic oscillator 1400 with a resonator component 1300 including three resonators. For instance, the resonator component 1300 can incorporate the CMRs of FIG. 13. The oscillator 1400 of FIG. 14 can be used to produce an output signal with multiple frequency components, such as a square wave. In some implementations, the resonator component 1300 serves as the resonator component 1212 of FIG. 12, with other circuit components of the oscillator 1400 being the same as in FIG. 12, as indicated by like reference numerals. As described above, the CMRs 1304, 1308, and 1312 are connected in parallel, in one example. Each CMR is configured so the oscillator 1400 outputs a respective resonant frequency, $F_{RES1}$, $F_{RES2}$, and $F_{RES3}$, corresponding to a respective CMR in component 1300. The output signal in the frequency domain 1404b is shown in FIG. 14.

In FIG. 14, the individual resonators 1304, 1308, and 1312 of the resonator component 1300 can be configured and constructed with appropriate dimensions as described above so the output resonant frequencies, $F_{RES1}$, $F_{RES2}$, and $F_{RES3}$ of the oscillator 1400 are the harmonic signal components of a desired signal form in the time domain, such as a square wave signal 1404b having a designated frequency or period. In this way, the synthesized square wave signal 1404b can be used as a clock signal for any of a variety of digital processing applications. To produce a substantially square wave signal 1404b, two of the CMRs in the resonator component 1300 can be configured so that $F_{RES2}$ and $F_{RES3}$ are odd integer harmonics of the first output resonant frequency, $F_{RES1}$. The CMR(s) can be constructed so one CMR is essentially tuned to produce a desired fundamental frequency, $F_{RES1}$, while others are tuned to produce odd integer harmonics $F_{RES2}$ and $F_{RES3}$. Thus, in this example, a clock signal can be produced with an amplifier component 1204 and a bank of CMRs 1304-1312 connected in parallel to serve as the resonator component 1300.

Returning to FIG. 13, in one example, the resonator 1312 is the widest of the three resonators, that is, along the X axis, and produces the lowest frequency component of the output signal, for instance, the fundamental frequency of the desired output signal. The resonator 1308 has a smaller width and produces a first or third integer harmonic of the fundamental, while the resonator 1304 has the smallest width to produce a higher order harmonic than the resonator 1308.

While the passive resonator component 1300 is described and illustrated above as including three individual resonators, any number of resonators can be incorporated and similarly connected to one another. For example, in FIG. 13, one of the resonators 1304, 1308, or 1312 can be omitted, leaving two resonators to output, respectively, a fundamental frequency and another frequency such as a third order harmonic of the desired output signal, such as a square wave. By the same token, additional resonators to the three illustrated in FIG. 13 can be similarly connected and tuned to produce additional frequencies, such as additional odd integer harmonics of the fundamental frequency, $F_{RES1}$. In the example of a clock signal, such additional frequency content can produce a closer-to-ideal square waveform.

In an alternative implementation, returning to FIG. 5, a single resonator such as a CMR can be used to produce three output resonant frequencies of an oscillator. In such an implementation, one resonator on one wafer can be used. In particular, the desired output frequencies can be sensed by the sensor 520 as the piezoelectric layer 208 is displaced back-and-forth along the respective X, Y and Z axes. In this way, different resonant frequencies can correspond to different movements of one CMR. Returning to the example of a clock signal application, the dimensions of the CMR can be configured so the oscillator outputs the desired fundamental frequency and two odd integer harmonics of a square wave signal as the piezoelectric material moves in the respective dimensions. For instance, in FIG. 5, the fundamental frequency of a square wave can be generated as the piezoelectric layer 208 moves along the X axis, the first harmonic can be produced as the piezoelectric layer 208 moves along the Y axis, and the third harmonic can be produced as piezoelectric layer 208 moves along the Z axis. Thus, the circuit of FIG. 12 can be used with a single CMR serving as the resonator component 1212 to produce the desired time- and/or frequency-domain signal.

In FIG. 13, the resonators included in the resonator component 1300 can be fabricated on the same wafer or on different wafers, depending on the desired implementation. By the same token, the resonator(s) of the resonator component 1212 can be fabricated on the same wafer or on a different wafer from the active component 1204 of FIG. 12.

The described implementations may be implemented in any device that is configured to display an image, whether in motion (e.g., video) or stationary (e.g., still image), and whether textual, graphical or pictorial. More particularly, it is contemplated that the implementations may be implemented in or associated with a variety of electronic devices such as, but not limited to, mobile telephones, multimedia Internet enabled cellular telephones, mobile television receivers, wireless devices, smartphones, bluetooth devices, personal data assistants (PDAs), wireless electronic mail receivers, hand-held or portable computers, netbooks, notebooks, smartbooks, tablets, printers, copiers, scanners, facsimile devices, GPS receivers/navigators, cameras, MP3 players, camcorders, game consoles, wrist watches, clocks, calculators, television monitors, flat panel displays, electronic reading devices (e.g., e-readers), computer monitors, auto displays (e.g., odometer display, etc.), cockpit controls and/or displays, camera view displays (e.g., display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (e.g., electromechanical systems (EMS), MEMS and non-MEMS), aesthetic structures (e.g., display of images on a piece of jewelry) and a variety of electromechanical systems devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes, electronic test equipment. Thus, the teachings are not intended to be limited to the implementations depicted solely in the figures, but instead have wide applicability as will be readily apparent to one having ordinary skill in the art.

An example of a suitable electromechanical systems (EMS) or MEMS device, to which the described implementations may apply, is a reflective display device. Reflective display devices can incorporate interferometric modulators (IMODs) to selectively absorb and/or reflect light incident thereon using principles of optical interference. IMODs can include an absorber, a reflector that is movable with respect to the absorber, and an optical resonant cavity defined between the absorber and the reflector. The reflector can be moved to two or more different positions, which can change the size of the optical resonant cavity and thereby affect the reflectance of the interferometric modulator. The reflectance spectrums of IMODs can create fairly broad spectral bands which can be shifted across the visible wavelengths to generate different colors. The position of the spectral band can be adjusted by changing the thickness of the optical resonant cavity, i.e., by changing the position of the reflector.

Figure 15A:
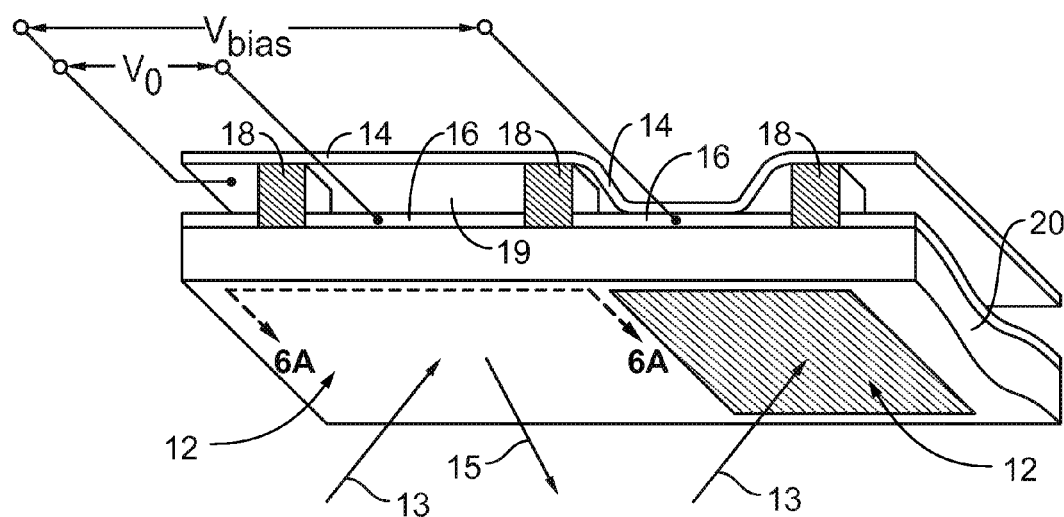
FIG. 15A shows an example of an isometric view depicting two adjacent pixels in a series of pixels of an interferometric modulator (IMOD) display device.

FIG. 15A shows an example of an isometric view depicting two adjacent pixels in a series of pixels of an interferometric modulator (IMOD) display device. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, i.e., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when unactuated, reflecting light outside of the visible range (e.g., infrared light). In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted portion of the pixel array in FIG. 15A includes two adjacent interferometric modulators 12. In the IMOD 12 on the left (as illustrated), a movable reflective layer 14 is illustrated in a relaxed position at a predetermined distance from an optical stack 16, which includes a partially reflective layer. The voltage V0 applied across the IMOD 12 on the left is insufficient to cause actuation of the movable reflective layer 14. In the IMOD 12 on the right, the movable reflective layer 14 is illustrated in an actuated position near or adjacent the optical stack 16. The voltage Vbias applied across the IMOD 12 on the right is sufficient to maintain the movable reflective layer 14 in the actuated position.

In FIG. 15A, the reflective properties of pixels 12 are generally illustrated with arrows 13 indicating light incident upon the pixels 12, and light 15 reflecting from the IMOD 12 on the left. Although not illustrated in detail, it will be understood by one having ordinary skill in the art that most of the light 13 incident upon the pixels 12 will be transmitted through the transparent substrate 20, toward the optical stack 16. A portion of the light incident upon the optical stack 16 will be transmitted through the partially reflective layer of the optical stack 16, and a portion will be reflected back through the transparent substrate 20. The portion of light 13 that is transmitted through the optical stack 16 will be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the IMOD 12.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals, e.g., chromium (Cr), semiconductors, and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and conductor, while different, more conductive layers or portions (e.g., of the optical stack 16 or of other structures of the IMOD) can serve to bus signals between IMOD pixels. The optical stack 16 also can include one or more insulating or dielectric layers covering one or more conductive layers or a conductive/absorptive layer.

In some implementations, the layer(s) of the optical stack 16 can be patterned into parallel strips, and may form row electrodes in a display device as described further below. As will be understood by one having skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of posts 18 and an intervening sacrificial material deposited between the posts 18. When the sacrificial material is etched away, a defined gap 19, or optical cavity, can be formed between the movable reflective layer 14 and the optical stack 16. In some implementations, the spacing between posts 18 may be approximately 1-1000 um, while the gap 19 may be less than 10,000 Angstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the IMOD 12 on the left in FIG. 15A, with the gap 19 between the movable reflective layer 14 and optical stack 16. However, when a potential difference, e.g., voltage, is applied to at least one of a selected row and column, the capacitor formed at the intersection of the row and column electrodes at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated IMOD 12 on the right in FIG. 15A. The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 15B:
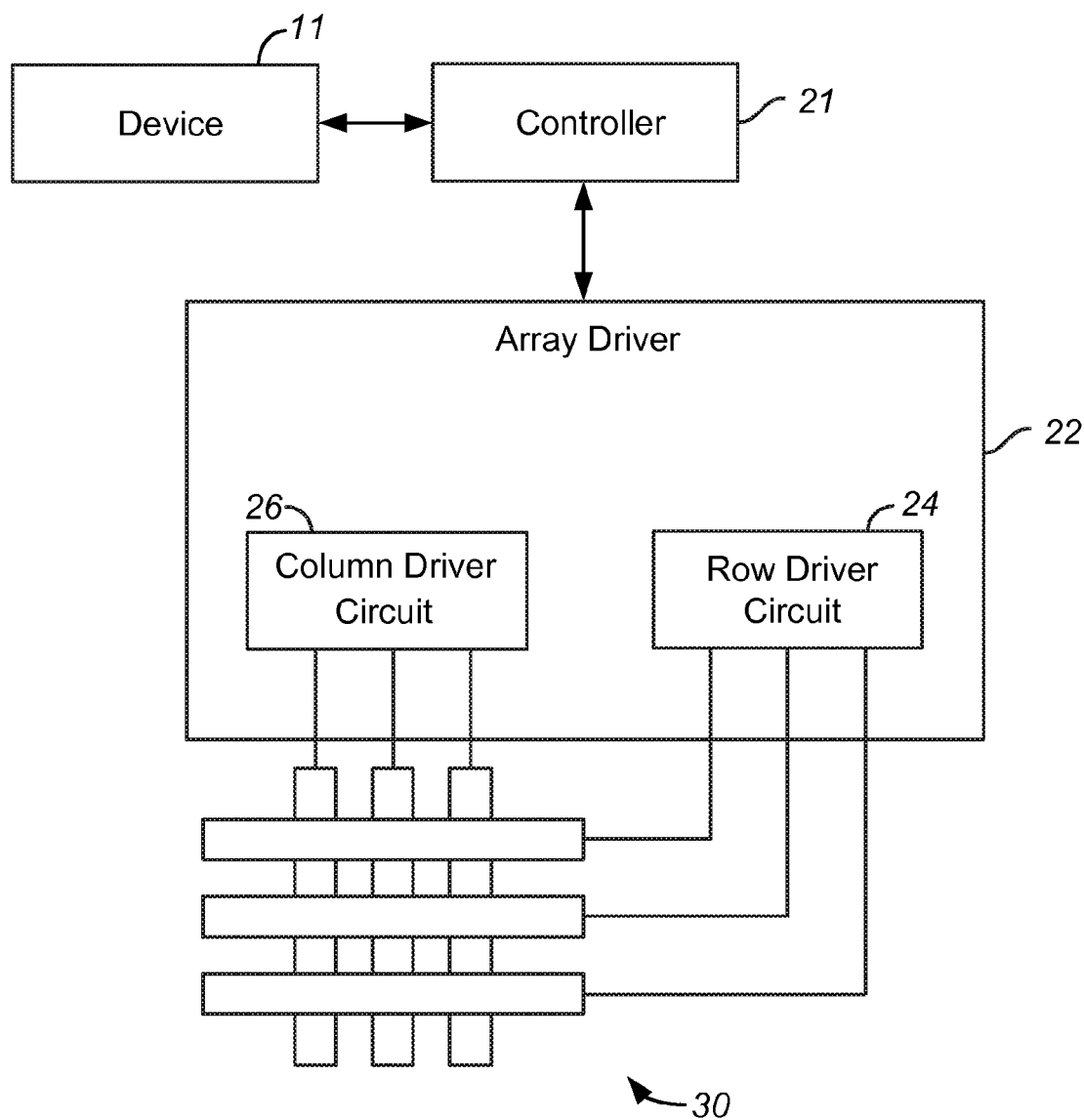
FIG. 15B shows an example of a system block diagram illustrating an electronic device incorporating an interferometric modulator display.

FIG. 15B shows an example of a system block diagram illustrating an electronic device incorporating a 3×3 interferometric modulator (IMOD) display. The electronic device of FIG. 15B represents one implementation in which a resonator device 11 constructed in accordance with the implementations described above with respect to FIGS. 1-14 can be incorporated. The electronic device in which device 11 is incorporated may, for example, form part or all of any of the variety of electrical devices and electromechanical systems devices set forth above, including both display and non-display applications.

Here, the electronic device includes a controller 21, which may include one or more general purpose single- or multi-chip microprocessors such as an ARM®, Pentium®, 8051, MIPS®, Power PC®, or ALPHA®, or special purpose microprocessors such as a digital signal processor, microcontroller, or a programmable gate array. Controller 21 may be configured to execute one or more software modules. In addition to executing an operating system, the controller 21 may be configured to execute one or more software applications, including a web browser, a telephone application, an email program, or any other software application.

The controller 21 is configured to communicate with device 11. The controller 21 also can be configured to communicate with an array driver 22. The array driver 22 can include a row driver circuit 24 and a column driver circuit 26 that provide signals to, e.g., a display array or panel 30. Although FIG. 15B illustrates a 3×3 array of IMODs for the sake of clarity, the display array 30 may contain a very large number of IMODs, and may have a different number of IMODs in rows than in columns, and vice versa. Controller 21 and array driver 22 may sometimes be referred to herein as being "logic devices" and/or part of a "logic system."

Figure 16A:
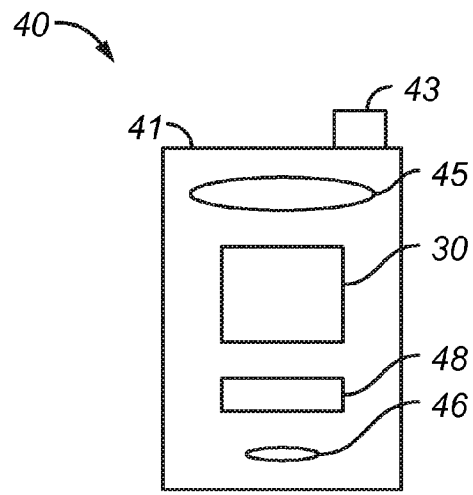
FIGS. 16A and 16B show examples of system block diagrams illustrating a display device that includes a plurality of interferometric modulators.
Figure 16B:
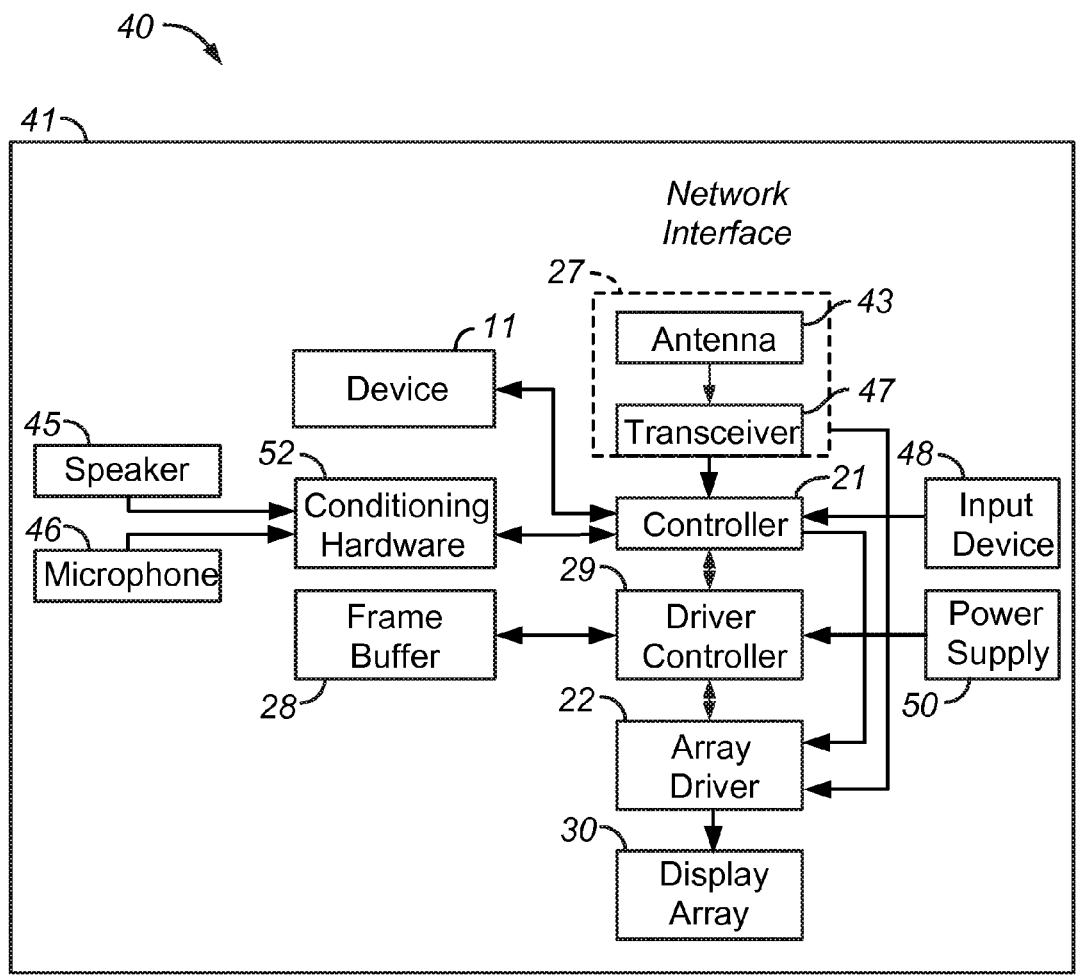

FIGS. 16A and 16B show examples of system block diagrams illustrating a display device 40 that includes a plurality of interferometric modulators. Display device 40 represents one example of an electronic device as described above. The display device 40 can be, for example, a cellular or mobile telephone. However, the same components of the display device 40 or slight variations thereof are also illustrative of various types of display devices such as televisions, e-readers and portable media players.

The display device 40 includes a housing 41, a display 30, an antenna 43, a speaker 45, an input device 48, and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber, and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display, as described herein.

The components of the display device 40 are schematically illustrated in FIG. 16B. The display device 40 includes a housing 41 and can include additional components at least partially enclosed therein. For example, the display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 can provide power to all components as required by the particular display device 40 design.

The network interface 27 includes the antenna 43 and the transceiver 47 so that the display device 40 can communicate with one or more devices over a network. The network interface 27 also may have some processing capabilities to relieve, e.g., data processing requirements of the processor 21. The antenna 43 can transmit and receive signals. In some implementations, the antenna 43 transmits and receives RF signals according to the IEEE 16.11 standard, including IEEE 16.11 (a), (b), or (g), or the IEEE 802.11 standard, including IEEE 802.11a, b, g or n. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43. One or more of the resonator structures described above can be incorporated in transceiver 47.

In some implementations, the transceiver 47 can be replaced by a receiver. In addition, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation, and gray-scale level. Controller 21 is also configured to interact with device 11 to perform desired operations.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components. In one implementation, device 11 is incorporated as a component of conditioning hardware 52.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (e.g., an IMOD controller). Additionally, the array driver 22 can be a conventional driver or a bi-stable display driver (e.g., an IMOD display driver). Moreover, the display array 30 can be a conventional display array or a bi-stable display array (e.g., a display including an array of IMODs). In some implementations, the driver controller 29 can be integrated with the array driver 22. Such an implementation is common in highly integrated systems such as cellular phones, watches and other small-area displays.

In some implementations, the input device 48 can be configured to allow, e.g., a user to control the operation of the display device 40. The input device 48 can include a keypad, such as a QWERTY keyboard or a telephone keypad, a button, a switch, a rocker, a touch-sensitive screen, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices as are well known in the art. For example, the power supply 50 can be a rechargeable battery, such as a nickel-cadmium battery or a lithium-ion battery. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance, or illustration." Any implementation described herein as "exemplary" is not necessarily to be construed as preferred or advantageous over other implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. Apparatus including a resonator-based oscillator, comprising:
an active component having an input and an output; and
a passive component having an input coupled to the active component output and an output coupled to the active component input, the passive component including one or more contour mode resonators (CMR) having dimensions including a length, a width, and a thickness and including:
a first conductive layer,
a second conductive layer,
a piezoelectric layer disposed between the first conductive layer and the second conductive layer,
an input electrode being defined in one of the conductive layers and longitudinally oriented along the length, the input electrode coupled to the passive component input, and
an output electrode being defined in one of the conductive layers and longitudinally oriented along the length, the output electrode coupled to the passive component output;
the one or more CMRs configured to resonate:
at a fundamental frequency, and
at a resonant frequency being an odd integer multiple of and different from the fundamental frequency, such that the passive component is configured to output the fundamental frequency and the resonant frequency; and
the active component configured to output a digital signal defined by the fundamental frequency and the resonant frequency.

2. The apparatus of claim 1, the passive component including:
a first CMR configured to generate the fundamental frequency; and
a second CMR configured to generate the resonant frequency.

3. The apparatus of claim 2, wherein the fundamental frequency is associated with one or more parameters of the first CMR, the one or more parameters selected from the group consisting of: the width of the first CMR, the length of the first CMR, the thickness of the first CMR, a spacing of electrodes in one or more of the conductive layers of the first CMR, and a width of electrodes in one or more of the conductive layers of the first CMR.

4. The apparatus of claim 2, wherein the resonant frequency is associated with one or more parameters of the second CMR, the one or more parameters selected from the group consisting of: the width of the second CMR, the length of the second CMR, the thickness of the second CMR, a spacing of electrodes in one or more of the conductive layers of the second CMR, and a width of electrodes in one or more of the conductive layers of the second CMR.

5. The apparatus of claim 2, further comprising:
a third CMR configured to generate a second resonant frequency being a further odd integer multiple of the fundamental frequency.

6. The apparatus of claim 2, wherein the CMRs are coupled in parallel.

7. The apparatus of claim 1, the passive component including:
a CMR configured to generate the fundamental frequency and the resonant frequency.

8. The apparatus of claim 7, wherein the fundamental frequency is associated with a first dimension of the CMR.

9. The apparatus of claim 8, wherein the resonant frequency is associated with a second dimension of the CMR.

10. The apparatus of claim 7, wherein the CMR is configured to generate a second resonant frequency being a further odd integer multiple of the fundamental frequency, the second resonant frequency being different from the fundamental frequency and the resonant frequency.

11. The apparatus of claim 10, wherein the fundamental frequency is associated with the width of the CMR, the resonant frequency is associated with the length of the CMR, and the second resonant frequency is associated with the thickness of the CMR.

12. The apparatus of claim 1, the passive component situated in a microelectromechanical systems (MEMS) device.

13. The apparatus of claim 12, the active component situated in the MEMS device.

14. The apparatus of claim 1, the digital signal being a substantially square wave signal at the fundamental frequency.

15. The apparatus of claim 14, the substantially square wave signal being a clock signal.

16. The apparatus of claim 1, the active component including an amplifier.

17. The apparatus of claim 1, further comprising:
a display;
a processor configured to communicate with the display, the processor being configured to process image data; and
a memory device configured to communicate with the processor.

18. The apparatus of claim 17, further comprising:
a driver circuit configured to send at least one signal to the display; and
a controller configured to send at least a portion of the image data to the driver circuit.

19. The apparatus of claim 17, further comprising:
an image source module configured to send the image data to the processor.

20. The apparatus of claim 19, the image source module including at least one of a receiver, transceiver, and transmitter.

21. The apparatus of claim 17, further comprising:
an input device configured to receive input data and to communicate the input data to the processor.

22. Apparatus including a resonator-based oscillator, comprising:
active component means for providing a digital signal defined by a fundamental frequency and a resonant frequency being an odd integer multiple of and different from the fundamental frequency, the active component means having an input and an output; and
passive component means for outputting the fundamental frequency and the resonant frequency, the passive component means having an input coupled to the active component means output and an output coupled to the active component means input, the passive component means including one or more contour mode resonators (CMR) having dimensions including a length, a width, and a thickness and including:
a first conductive layer,
a second conductive layer,
a piezoelectric layer disposed between the first conductive layer and the second conductive layer,
an input electrode being defined in one of the conductive layers and longitudinally oriented along the length, the input electrode coupled to the passive component means input, and an output electrode being defined in one of the conductive layers and longitudinally oriented along the length, the output electrode coupled to the passive component means output.

23. The apparatus of claim 22, the passive component means including:
- a first CMR configured to generate the fundamental frequency; and
- a second CMR configured to generate the resonant frequency.

24. The apparatus of claim 22, the passive component means including:
- a CMR configured to generate the fundamental frequency and the resonant frequency.

* * * * *